US008987603B2

(12) United States Patent
Shirai et al.

(10) Patent No.: US 8,987,603 B2
(45) Date of Patent: *Mar. 24, 2015

(54) MULTILAYER PRINTED WIRING BOARD WITH FILLED VIAHOLE STRUCTURE

(75) Inventors: Seiji Shirai, Ibi-gun (JP); Kenichi Shimada, Ibi-gun (JP); Motoo Asai, Ibi-gun (JP)

(73) Assignee: Ibiden Co,. Ltd., Ogaki-shi (JP)

( * ) Notice: Subject to any disclaimer, the term of this patent is extended or adjusted under 35 U.S.C. 154(b) by 107 days.

This patent is subject to a terminal disclaimer.

(21) Appl. No.: 13/348,708

(22) Filed: Jan. 12, 2012

(65) Prior Publication Data

US 2012/0103680 A1    May 3, 2012

Related U.S. Application Data

(63) Continuation of application No. 12/646,517, filed on Dec. 23, 2009, now Pat. No. 8,115,111, which is a continuation of application No. 12/164,710, filed on Jun. 30, 2008, now Pat. No. 7,737,366, which is a (Continued)

(30) Foreign Application Priority Data

| Feb. 26, 1998 | (JP) | 10-045396 |
| Feb. 26, 1998 | (JP) | 10-045397 |
| Feb. 26, 1998 | (JP) | 10-045398 |
| Feb. 26, 1998 | (JP) | 10-045399 |

(51) Int. Cl.
*H05K 1/03*      (2006.01)
*H05K 3/46*      (2006.01)
(Continued)

(52) U.S. Cl.
CPC ............. *H05K 3/4661* (2013.01); *H05K 3/421* (2013.01); *H05K 3/108* (2013.01); *H05K 3/381* (2013.01);
(Continued)

(58) Field of Classification Search
CPC ... H05K 1/0284; H05K 1/0298; H05K 1/113; H05K 1/119; H05K 1/115; H05K 3/421; H05K 3/4661; H05K 3/108; H05K 3/381; H05K 3/382; H05K 3/423; H05K 2201/09745; H05K 2201/0129; H05K 2201/015; H05K 2201/0278; H05K 2201/09563; H05K 2201/096

See application file for complete search history.

(56) References Cited

U.S. PATENT DOCUMENTS

| 3,350,498 A | 10/1967 | Leeds |
| 3,536,546 A | 10/1970 | Nielsen et al. |

(Continued)

FOREIGN PATENT DOCUMENTS

| EP | 0 321 977 | 6/1989 |
| EP | 0 490 211 | 6/1992 |

(Continued)

OTHER PUBLICATIONS

Database WPI Section Ch, Week 198022, Derwent Publications Ltd., London, GB; AN 1980-39341c, Document XP002238554.

(Continued)

*Primary Examiner* — Ishwarbhai B Patel
(74) *Attorney, Agent, or Firm* — Oblon, McClelland, Maier & Neustadt, L.L.P.

(57) ABSTRACT

A multilayer printed wiring board includes a multilayered structure having conductor circuit layers and interlaminar insulative layers, the interlaminar insulative layers including an outermost interlaminar insulative layer, the conductor circuit layers including an outermost conductor circuit layer formed over the outermost interlaminar insulative, a filled-viahole formed in the outermost interlaminar insulative layer and having one or more metal plating fillings and completely closing a hole formed through the outermost interlaminar insulative layer such that the metal plating of the filled-viahole extends out of the hole and forms a substantially flat surface, and solder bumps including a first solder bump formed on the substantially flat surface of the filled-viahole and a second solder bump formed on a surface portion in the outermost conductor circuit layer. The substantially flat surface of the filled-viahole is leveled substantially at the same height as the surface portion of the outermost conductor circuit layer.

20 Claims, 5 Drawing Sheets

Related U.S. Application Data continuation of application No. 11/385,904, filed on Mar. 22, 2006, now Pat. No. 7,622,183, which is a continuation of application No. 11/020,035, filed on Dec. 23, 2004, now Pat. No. 7,390,974, which is a continuation of application No. 09/600,890, filed as application No. PCT/JP99/00504 on Feb. 5, 1999, now Pat. No. 7,071,424.

(51) Int. Cl.
*H05K 3/42* (2006.01)
*H05K 3/10* (2006.01)
*H05K 3/38* (2006.01)

(52) U.S. Cl.
CPC ............... *H05K 3/382* (2013.01); *H05K 3/423* (2013.01); *H05K 2201/0129* (2013.01); *H05K 2201/015* (2013.01); *H05K 2201/0278* (2013.01); *H05K 2201/09563* (2013.01); *H05K 2201/096* (2013.01); *H05K 2201/09745* (2013.01)
USPC ........................... 174/255; 174/262; 174/264

(56) References Cited

U.S. PATENT DOCUMENTS

| | | |
|---|---|---|
| 4,680,220 A | 7/1987 | Johnson |
| 4,715,894 A | 12/1987 | Holtzman et al. |
| 4,747,897 A | 5/1988 | Johnson |
| 4,769,270 A | 9/1988 | Nagamatsu et al. |
| 4,937,132 A | 6/1990 | Gaku et al. |
| 5,055,321 A | 10/1991 | Enomoto et al. |
| 5,103,293 A | 4/1992 | Bonafino et al. |
| 5,208,656 A | 5/1993 | Matsuyama et al. |
| 5,406,034 A | 4/1995 | Frei et al. |
| 5,509,200 A | 4/1996 | Frankeny et al. |
| 5,576,630 A | 11/1996 | Fujita |
| 5,578,341 A | 11/1996 | Hirosawa |
| 5,652,055 A | 7/1997 | King et al. |
| 5,662,987 A | 9/1997 | Mizumoto et al. |
| 5,699,613 A | 12/1997 | Chong et al. |
| 5,744,758 A | 4/1998 | Takenouchi et al. |
| 5,745,333 A * | 4/1998 | Frankeny et al. ............ 361/313 |
| 5,816,478 A | 10/1998 | Kaskoun et al. |
| 5,827,604 A | 10/1998 | Uno et al. |
| 5,956,843 A * | 9/1999 | Mizumoto et al. ............ 29/852 |
| 6,030,693 A | 2/2000 | Boyko et al. |
| 6,098,282 A | 8/2000 | Frankeny et al. |
| 6,127,633 A | 10/2000 | Kinoshita |
| 6,162,997 A | 12/2000 | Memis |
| 6,291,778 B1 | 9/2001 | Asai et al. |
| 6,294,744 B1 | 9/2001 | Kinoshita |
| 6,365,843 B1 | 4/2002 | Shirai et al. |
| 6,444,919 B1 * | 9/2002 | Economikos et al. ........ 174/255 |
| 6,534,723 B1 | 3/2003 | Asai et al. |
| 6,762,921 B1 | 7/2004 | Asai et al. |
| 6,828,510 B1 | 12/2004 | Asai et al. |
| 7,071,424 B1 | 7/2006 | Shirai et al. |

FOREIGN PATENT DOCUMENTS

| | | |
|---|---|---|
| EP | 0 727 926 | 8/1996 |
| EP | 0 743 812 | 11/1996 |
| EP | 0 776 150 A1 | 5/1997 |
| JP | 49-093863 | 9/1974 |
| JP | 56-100497 | 8/1981 |
| JP | 56-122194 | 9/1981 |
| JP | 62-090808 | 4/1987 |
| JP | 62-256496 | 11/1987 |
| JP | 62-283694 | 12/1987 |
| JP | 01-184997 | 7/1989 |
| JP | 02-054599 | 2/1990 |
| JP | 02-188992 | 7/1990 |
| JP | 03-003297 | 1/1991 |
| JP | 03-003298 | 1/1991 |
| JP | 3-120892 | 5/1991 |
| JP | 4-162494 | 6/1992 |
| JP | 05-003388 | 1/1993 |
| JP | 05-090761 | 4/1993 |
| JP | 05-218645 | 8/1993 |
| JP | 05-218646 | 8/1993 |
| JP | 06-069648 | 3/1994 |
| JP | 06-196856 | 7/1994 |
| JP | 06-244556 | 9/1994 |
| JP | 06-260766 | 9/1994 |
| JP | 06-310856 | 11/1994 |
| JP | 07-034048 | 2/1995 |
| JP | 7-45948 | 2/1995 |
| JP | 07-079078 | 3/1995 |
| JP | 7-147483 | 6/1995 |
| JP | 7-154073 | 6/1995 |
| JP | 07-235768 | 9/1995 |
| JP | 07-245484 | 9/1995 |
| JP | 7-283538 | 10/1995 |
| JP | 07-283539 | 10/1995 |
| JP | 07-336017 | 12/1995 |
| JP | 08-018239 | 1/1996 |
| JP | 8-46079 | 2/1996 |
| JP | 8-139452 | 5/1996 |
| JP | 8-250857 | 9/1996 |
| JP | 09-008458 | 1/1997 |
| JP | 9-23065 | 1/1997 |
| JP | 09-083138 | 3/1997 |
| JP | 09-191178 | 7/1997 |
| JP | 09-214140 | 8/1997 |
| JP | 09-214141 | 8/1997 |
| JP | 9-266375 | 10/1997 |
| JP | 9-298364 | 11/1997 |
| JP | 09-307239 | 11/1997 |
| JP | 09-312472 | 12/1997 |
| JP | 09-331140 | 12/1997 |
| JP | 10-004254 | 1/1998 |
| JP | 10-013026 | 1/1998 |
| JP | 10-046119 | 2/1998 |
| KR | 1997-0004029 | 3/1997 |
| KR | 1997-7005331 | 9/1997 |
| WO | WO 96/39796 | 12/1996 |

OTHER PUBLICATIONS

Database WPI Section Ch, Week 198145, Derwent Publications Ltd., London, GB; AN 1981-82484d, Document XP002238555.

\* cited by examiner

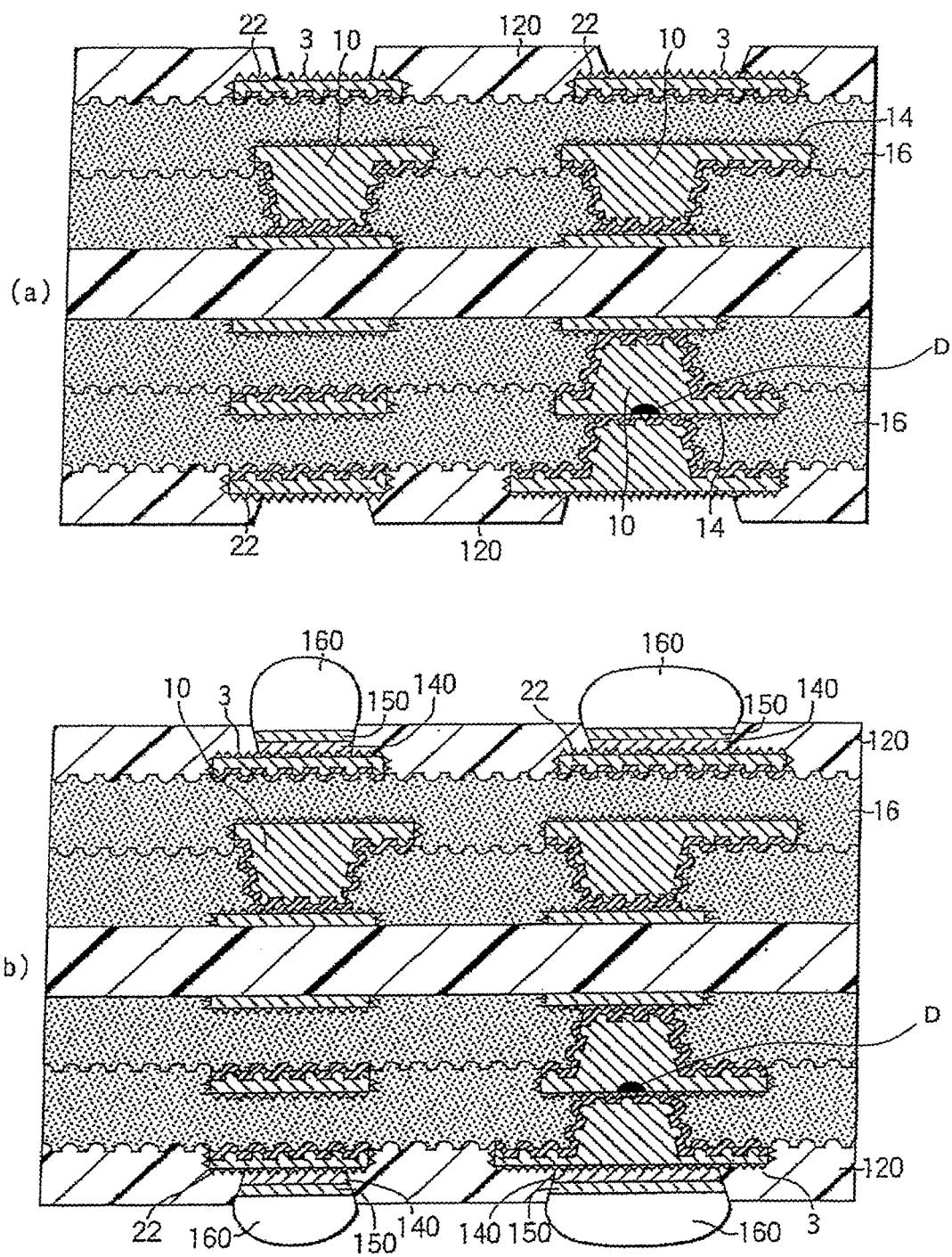

MULTILAYER PRINTED WIRING BOARD WITH FILLED VIAHOLE STRUCTURE

CROSS REFERENCE TO RELATED APPLICATIONS

The present application is a continuation of and claims the benefit of priority from U.S. patent application Ser. No. 12/646,517, filed Dec. 23, 2009, now U.S. Pat. No. 8,115,111, issued Feb. 14, 2012, which is a continuation of and claims the benefit of priority from U.S. patent application Ser. No. 12/164,710, filed Jun. 30, 2008, now U.S. Pat. No. 7,737,366, issued Jun. 15, 2010, the entire contents of each of which are incorporated herein by reference. U.S. patent application Ser. No. 12/164,710 is a continuation of U.S. patent application Ser. No. 11/385,904, filed Mar. 22, 2006, now U.S. Pat. No. 7,622,183, issued Nov. 24, 2009, which is a continuation of U.S. patent application Ser. No. 11/020,035, filed Dec. 23, 2004, now U.S. Pat. No. 7,390,974, issued Jun. 24, 2008, which is a continuation of U.S. patent application Ser. No. 09/600,890, filed Aug. 16, 2000, now U.S. Pat. No. 7,071,424, issued Jul. 4, 2006, which is a National Stage of PCT/JP99/00504, filed Feb. 5, 1999, which was not published in English under PCT Article 21(2). The present application is based on and claims priority under 35 U.S.C. §119of Japanese Application Nos. JP 10-45396, filed Feb. 26, 1998; JP 10-45397, filed Feb. 26, 1998; JP 10-45398, filed Feb. 26, 1998; and JP 10-45399, filed Feb. 26, 1998.

BACKGROUND OF THE INVENTION

1. Field of the Invention

The present invention relates to a multilayer printed wiring board having a filled viahole structure, and more particularly to a multilayer printed wiring board adapted to assure an outstandingly secure adhesion between a conductor circuitry layer and an interlaminar insulative resin layer and form a fine conductor circuit pattern.

2. Description of Background Information

The multilayer printed wiring board includes a build-up multilayer printed wiring board in which conductor circuitry layers and insulative resin layers are alternately formed one on another and inner and outer ones of the conductor circuitry layers are electrically connected to each other by viaholes formed in the insulative resin layers. Generally, the viaholes in such a multilayer printed wiring board are formed by depositing a plating metal film on the inner wall and bottom of each of fine holes formed through the interlaminar insulative resin layers.

However, the multilayer printed wiring board having such viaholes formed through them are not advantageous in that the metal deposit is likely to break due to its precipitation or a heat cycle. To avoid this problem, it has recently been proposed to fill the viaholes with a plating metal (this structure will be referred to as "filled viahole structure" henceforth). Such filled viahole structures are known from the disclosure, for example, in the Japanese unexamined patent publication Nos. Hei 2-188992, Hei 3-3298 and Hei 7-34048.

The multilayer printed wiring board having the filled viahole structure is however disadvantageous in that a surface portion of the plating metal exposed outside the hole for viahole (the surface will be referred to as "viahole surface" henceforth) is easily depressible. If an interlaminar insulating layer resin is formed on a conductor circuitry layer irrespectively of such a depression existent on the viahole surface, a corresponding depression will develop on the surface of the interlaminar insulative resin layer, and cause the plating metal film to break and also a trouble in mounting electronic parts on the wiring board.

The viahole surface where such a depression or concavity exists or is likely to exist can be flattened by applying an interlaminar resin more than once. However, the application of the interlaminar resin will lead to a greater thickness of the interlaminar insulative resin layer just above the depression on the viahole surface than that of the interlaminar insulative resin layer on the conductor circuitry layer. Thus in the process of forming a hole for a viahole in the interlaminar insulative resin layer by exposure, development and laser radiation, the interlaminar resin will partially remain inside the hole to lower the electrical connection reliability of the viahole. Especially for mass production of multilayer printed wiring boards, the residual resin is likely to occur since it is difficult to set different exposure and development conditions for the viahole surface from those for the conductor circuitry layer surface.

Further, to solve the problem of such a residual resin, a build-up multilayer printed wiring board has been proposed by the Japanese unexamined patent publication No. Hei 9-312472, etc.

In this conventional multilayer printed wiring board, a plating conductor or metal is filled in a hole for viahole so that a conductor circuitry layer has a thickness more than a half of the viahole diameter and thus the conductor circuitry layer surface is at a same level as the viahole surface.

In this conventional multilayer printed wiring board, however, the inner wall of the hole formed in an interlaminar insulative resin layer should be plated with a thick layer of metal or conductor and thus a conductor circuitry layer formed along with the plating metal on the viahole will also be thick.

For a thicker plating, the plating resin should also be correspondingly thicker. As a result, light will be diffracted to inside a pattern on a photomasking film, so that the plating resist will be taper. That is, there will be resulted a conductor pattern which is thinner as it goes downward. Such a phenomenon will not matter so long as L/S=50/50 µm where L: line width; S: inter-line distance, but it will cause a pattern separation (peeling) if the pattern is a fine one of L/S=25/25 µm.

Further, as disclosed in the Japanese unexamined patent publication No. Hei 2-188992, when a plating layer is formed and then it is etched to form a conductor circuitry layer, a thick plating layer will be undercut due to the etching and a fine pattern will be broken.

Furthermore, since in the filled viahole structure, a plating metal is filled in a hole for viahole, a larger stress will be caused by heat cycle than in a viahole formed just by plating an inner wall and bottom of a hole, so that a crack is likely to occur first in the viahole and then spread to an interlaminar insulative resin layer.

Moreover, an electroless plating method is used to fill the plating metal into the hole for viahole. However, the plating layer applied by the electroless plating is harder and less malleable than a one applied by the electroplating. Therefore, the plating layer is likely to crack under a thermal shock or due to heat cycle.

To solve the above problem, a method of forming a filled viahole structure by using both electroless plating and electroplating has been proposed as disclosed in the Japanese unexamined patent publication No. Hei 9-312472.

In this filled viahole structure, however, the boundary between the electroless plating and electroplating layers is flat so that both the plating layers are separable from each other under a thermal shock or due to heat cycle. To avoid this separation, a plating resist has to be formed before a hole for viahole is filled with a metal by the electroplating. However, since the plating resist is formed on the electroless plating layer, the plating resist is easily separable and an inter-pattern shortcircuit will possibly take place.

Accordingly, the present invention has a primary object to overcome the above-mentioned drawbacks of the prior art by providing a multilayer printed wiring board having a filled viahole structure adapted to form a fine conductor circuit pattern and provide a highly reliable electrical connection between conductive circuitry layers.

The present invention has another object to provide a multilayer printed wiring board having a filled viahole structure adapted to assure a highly secure adhesion between a conductor circuitry layer and an interlaminar insulative resin layer and which will not crack even under a thermal shock or due to heat cycle.

SUMMARY OF THE INVENTION

The above objects can be attained by providing a multilayer printed wiring board worked out to meet some parameters the inventors' have found through various studies and under which there can be formed on a conductor layer between interlaminar insulative resin layers a conductor circuit pattern highly securely adhering to the interlaminar insulative resin layer and conductor layer.

According to one aspect of the present invention (henceforth, first embodiment), there is provided a build-up multilayer printed wiring board having conductor circuitry layers and interlaminar insulative resin layers deposited alternately one on another, the interlaminar insulative resin layers having formed through them holes each filled with a plating layer to form a viahole, the surface of the plating layer exposed out of the hole for the viahole (the surface will be referred to as "viahole surface" henceforth) being formed substantially flat and lying at a substantially same level as the surface of the conductor circuit layer disposed in the interlaminar insulative resin layer in which the viahole also lies, and the thickness of the conductor circuitry layer being less than a half of the viahole diameter.

Note that the "viahole diameter" referred to herein means an opening diameter of the hole for the viahole.

The first embodiment having the above-mentioned filled viahole structure is advantageous as follows:

(1) Because no depression develops on the viahole surface, the surface of the interlaminar insulative resin layer is very flat, so a line breaking due to a depression hardly occurs and IC chips, etc. can be conveniently mounted on the wiring board.

(2) Since the thickness of the interlaminar insulative resin layer on the viahole and conductor circuitry layer is substantially uniform, the insulative resin of the interlaminar layer will less remain when a hole for the viahole is formed in the interlaminar insulative resin layer, thus the electrical connection by the viahole is more highly reliable.

(3) Since the thickness of the conductor circuitry layer is less than the half of the viahole diameter, it can be small although the hole for the viahole is filled with the plating metal. Thus the plating resin can be thin, which allows to form a finer conductor circuit pattern.

According to another aspect of the present invention (henceforth, second embodiment), there is provided a build-up multilayer printed wiring board having conductor circuitry layers and interlaminar insulative resin layers deposited alternately one on another, the interlaminar insulative resin layers having formed through them holes each filled with a plating layer to form a viahole, the thickness of the conductor circuitry layer being less than a half of the viahole diameter and less than 25 μm.

In the second embodiment having the above-mentioned filled viahole structure, the thickness of the plating conductor forming the conductor circuitry layer can be less than the half of the viahole and less than 25 μm. Thus, there can be formed a thinner plating resist having an improved resolution, which enables to easily form the conductor circuitry by etching and pattern an ultra-fine circuit.

The first and second embodiments of the present invention should preferably be constructed as follows:

① The viahole and conductor circuitry layer surfaces are roughened, which will contribute to an improved adhesion between the viahole, conductor circuitry layer and interlaminar insulative resin layers.

② The surface of the interlaminar insulative layer including the inner wall of the hole for the viahole is roughened. Thus, an improved adhesion is assured between the viahole formed from the filled plating metal and interlaminar insulative resin layer, as well as between the conductor circuitry layer and interlaminar insulative resin layer.

③ The conductor circuitry layer (inner pad) to which the viahole bottom connects has a surface thereof roughened and by which it is connected to the viahole. Thus, the adhesion between the viahole and inner pad (inner conductor circuitry layer) is improved, which will lead to a possibility that the viahole and conductor circuitry layer is hardly separable from each other at their boundary even at a high temperature and humidity or by heat cycle.

Particularly, in a build-up multilayer printed wiring board derived from a combination of the above items ② and ③, the inner pad and also the viahole securely adhere to the interlaminar insulative resin layer, so that the inner pad and viahole are completely integral with each other with the interlaminar insulative resin layer lying between them.

④ The conductor circuitry layer has an edge thereof also roughened, which will prevent a crack which would take place first at the boundary between the conductor circuitry layer edge and interlaminar insulative resin layer due to an insufficient adhesion between the circuit edge and resin layer and spread the resin layer.

⑤ Preferably, another viahole should be formed on one viahole, which makes it possible to eliminate any dead space of the wiring by the viahole and thereby attain a further high density of wiring.

⑥ The interlaminar insulative resin layer should preferably be made of a composite of a thermoplastic resin and thermosetting resin or only a thermoplastic resin. Such a tough resin or resin compound filled in the viahole will be able to positively prevent a crack from taking place even when a great stress develops in the filled viahole.

⑦ The ratio between the viahole diameter and interlaminar insulative resin layer should preferably be within a range of 1 to 4, which will facilitate a finer patterning.

⑧ Particularly for the first embodiment, the thickness of the conductor circuitry layer of the first embodiment should preferably be less than 25 μm. For easier formation of a fine pattern, the thickness should more preferably be 20 μm or less.

⑨ Especially for the second embodiment, the viahole surface exposed out of the hole for viahole, namely, the central portion of the exposed surface of the viahole should preferably be depressed and the depressed surface preferably be roughened.

The depression thus formed will provide an obtuse angle defined between contact surface edges of a viahole and a further viahole formed on the preceding one. A stress to the viahole surface edges is thus dispersed, so that a crack can be prevented from taking place and spreading from the contact surface edges to the interlaminar insulative resin layer.

The roughening of the depressed surface improves the adhesion between the viahole, conductor layer on which the conductor circuit is formed, and interlaminar insulative resin layer, which assures to prevent the conductor layer from separating from the other.

According to a still another aspect of the present invention (henceforth, third embodiment), there is provided a build-up multilayer printed wiring board having conductor circuitry layers and interlaminar insulative resin layers deposited alternately one on another, the interlaminar insulative resin layers having formed through them holes each filled with a plating layer to form a viahole, the hole in the interlaminar insulative resin layer having at least an inner wall thereof roughened, the roughened inner wall of the hole being covered with an electroless plating layer, and an inner space of the hole defined by the electroless plating layer being filled with an electroplating layer to form the viahole.

In the third embodiment having the above-mentioned fill viahole structure, the electroless plating layer harder than the electroplating layer is formed over the inner wall of the hole. The electroless plating layer bites, like anchor, the roughened surface, so it is not easily broken even if applied with a separating force. As a result, the adhesion between the viahole and interlaminar insulative resin layer is improved. Also, since the electroplating layer having a larger malleability than the electroless plating layer fills the major part of the hole, the electroplating layer will flexibly follow the expansion and shrinkage of the interlaminar insulative resin layer, thus the layers can be prevented from being cracked under a thermal shock or due to heat cycle.

When the surface including the inner wall of the hole in the insulative resin layer is roughened, an electroless plating layer formed on the roughened surface will have a correspondingly roughened surface. The roughened surface or surface irregularity provides an effect of anchoring to assure a strong adhesion to the electroplating layer. Therefore, there will not occur any separation between the electroless plating layer and electroplating layer even under a thermal shock or due to heat cycle.

Also a plating resist applied on the roughened surface including the inner wall of the hole in the interlaminar insulative resin layer will have a close contact with the irregular surface of the electroless plating layer, and thus it will not easily be separated from the electroless plating layer surface. Therefore, there will not arise a shortcircuit between the conductor circuitry layers in the process of manufacturing a printed wiring board by the semi-additive method.

The third embodiment of the present invention should preferably be constructed as in the above items ① to ⑨.

According to a yet another aspect of the present invention (henceforth, fourth embodiment), there is provided a build-up multilayer printed wiring board formed from conductor circuitry layers and interlaminar insulative resin layers deposited alternately one on another, the interlaminar insulative resin layers having formed through them holes each filled with a plating layer to form a viahole, the interlaminar insulative resin layer being formed from a composite of a fluororesin and a heat-resistant thermoplastic resin, composite of a fluororesin and a thermosetting resin, or a composite of a thermosetting resin and a heat-resistant thermoplastic resin.

In the fourth embodiment having the above-mentioned filled viahole structure, since the interlaminar insulative resin layer through which the viahole is provided is formed from a "composite of fluororesin and heat-resistant thermoplastic resin", "composite of fluororesin and thermosetting resin", or a "composite of thermosetting resin and heat-resistant thermoplastic resin", the metal layer will not crack first at the viahole even when the metal layer is expanded due to heat cycle. Also, the low dielectric constant of the fluororesin will not cause any delayed signal propagation.

The interlaminar insulative resin layer in the build-up multilayer printed wiring board according to the present invention should particularly preferably be formed from a composite of a cloth of fluororesin fiber and a thermosetting resin filled in voids in the cloth.

Also, the fourth embodiments should preferably be constructed as in the above-mentioned items ① to ④ and ⑥ to ⑨.

BRIEF DESCRIPTION OF THE DRAWINGS

FIGS. 5(a) and 5(b) shows various steps included in the process of manufacturing the eleventh example of multilayer printed wiring board according to the present invention.

DETAILED DESCRIPTION OF THE INVENTION

Figure 1:
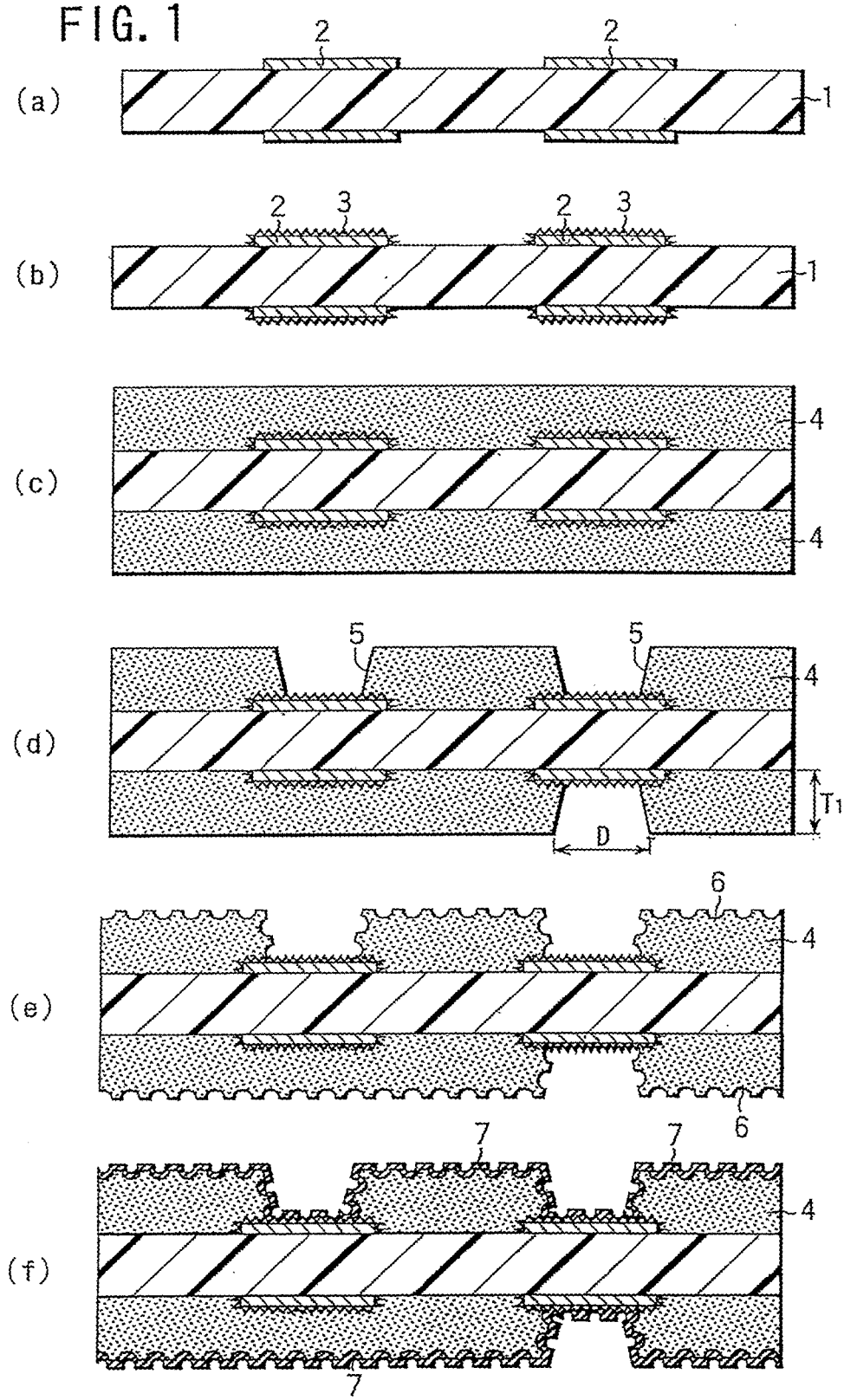
FIGS. 1(a)-1(f) show various steps included in the process of manufacturing the first example of multilayer printed wiring board according to the present invention.

The best modes of carrying out the present invention will be discussed in detail with reference to the accompanying drawings.

(A) In a multilayer printed wiring board having conductor circuitry layers and interlaminar insulative resin layers deposited alternately one on another and in which the interlaminar insulative resin layers have formed through them holes each filled with a plating layer to form a viahole, according to the first embodiment of the present invention, the surface of the viahole formed from each hole filled with the plating layer is formed substantially flat and lies at a substantially same level as the surface of the conductor circuit later disposed in the interlaminar insulative resin layer in which the viahole also lies, and the thickness of the conductor circuitry layer is less than a half of the viahole diameter.

In the printed wiring board according to the first embodiment, since the viahole surface is not depressed and so the surface of the interlaminar insulative resin layer is very flat, a line breaking due to a depression can be avoided, and IC chips, etc. can be easily mounted on the wiring board without any inconvenience. Also, the interlaminar insulative resin layer on the viahole and conductive circuitry layer is uniformly thick, the resin will less reside when a hole for viahole is formed in the resin layer. Further, since the thickness of the conductor circuitry layer is less than the half of the viahole diameter, even when the hole for the viahole is filled with the plating metal to form a viahole, the conductor circuitry layer will have an increased thickness, so the plating resin layer can be thin, which allows to form a finer conductor circuit pattern.

In the multilayer printed wiring board having the above-mentioned filled viahole structure, the inner wall of the hole in the interlaminar insulative resin layer should preferably be roughened, which will improve the adhesion between the viahole formed from a filled plating metal and the interlaminar insulative resin layer.

Further, the viahole should preferably be connected to the roughened surface of the inner conductor circuitry layer. Since the roughened surface improve the contact and thus adhesion between the circuitry layer and viahole, the circuitry layer and viahole will not easily be separated from each other at their boundary even at a high temperature and humidity or by heat cycle.

Roughening the conductor circuitry layer, if applied, will advantageously prevent a crack which would develop first at the boundary between the circuitry layer and interlaminar insulative resin layer and then perpendicularly towards the interlaminar insulative resin layer.

The circuitry layer surface roughening should preferably be limited to a depth of 1 to 10 µm. A deeper surface roughening will cause an inter-layer shortcircuit while a shallower surface roughening will degrade the inter-layer adhesion.

The roughening should preferably be done by oxidation (blackening), and reduction, of the surface of the circuitry layer, spraying an aqueous mixed solution of an organic acid and a cupric complex, or by electroless copper-nickel-phosphorus plating.

Of the above methods, the oxidation (blackening) and reduction use an oxidation bath of NaOH (20 g/l), NaClO$_2$ (50 g/l) and Na$_3$PO$_4$ (15.0 g/l), I and a reduction bath of NaOH (2.7 g/l) and NaBH$_4$ (1.0 g/l), respectively.

In the spraying, the aqueous mixed solution of organic acid and cupric complex will dissolve a metal foil such as copper forming the lower conductor circuitry layer in the existence of oxygen, namely, during spraying or bubbling as will be discussed below:

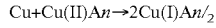

$$Cu+Cu(II)An \rightarrow 2Cu(I)An_{1/2}$$

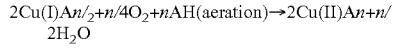

$$2Cu(I)An_{1/2}+n/4O_2+nAH(aeration) \rightarrow 2Cu(II)An+n/2H_2O$$

where A: Complexing agent; n: Coordination number.

The cupric secondary complex used in the above method should preferably be a cupric secondary complex of any one of azoles. The cupric secondary complex of an azole is used to oxidize a metal copper. One should preferably be diazole, triazole or tetrazole, and more preferably, imidazole, 2-methylimidazole, 2-ethylimidazole, 2-ethyl-4-methylimidazole, 2-phenylimidazole or 2-undecylimidazole.

The cupric secondary complex of azole should preferably, be used in an amount of 1 to 15% by weight. In this range of content, the cupric secondary complex shows an outstanding solubility and stability.

The organic acid is used in the aqueous solution to dissolve the copper oxide, and should preferably be at least one selected from formic acid, acetic acid, propionic acid, butyric acid, valerianic acid, caproic acid, acrylic acid, crotonic acid, oxalic acid, malonic acid, succinic acid, glutaric acid, maleic acid, benzoic acid, glycolic acid, lactic acid, malic acid, and sulfamic acid.

The content of the organic acid should preferably be 0.1 to 30% by weight in order to maintain the solubility of the copper oxide and stability of the dissolved copper oxide.

A cuprous complex produced will be dissolved under the action of the acid and combined with an oxygen to produce a cupric secondary complex which will contribute to copper oxidation again.

To promote oxidation of copper dissolution and azole oxidation, a halogen, for example, fluorine ion, chlorine ion or bromine ion may be added to an etchant or etching solution of the organic acid and cupric complex. The halogen ion may a one to which hydrochloric acid, sodium chloride, etc. is added.

The content of the halogen ion should preferably be 0.01 to 20% by weight. In this range of content, the layer surface roughened by attacking by the etchant will provide a secure adhesion between the conductor circuitry layer and interlaminar insulative resin layer.

The etchant of the organic acid and cupric secondary complex is prepared by dissolving a cupric secondary complex of an azole and an organic acid (containing a halogen ion as necessary) in water.

For the formation of a needle-like alloy by the electroless copper-nickel-phosphorus plating, a plating bath should preferably be used which is composed of 1 to 40 g/l of copper sulfate, 0.1 to 6.0 g/l of nickel sulfate, 10 to 20 g/l of citric acid, 10 to 100 g/l of hypophosphite, 10 to 40 g/l of boric acid and 0.01 to 10 g/l of a surfactant.

Further, in the multilayer printed wiring board according to this embodiment, a further viahole should preferably be formed on one filled viahole to eliminate any viahole-caused dead space for wiring, which will implement a higher density of wiring.

According to this embodiment, the multilayer printed wiring board can use, as the interlaminar insulative resin layer, a thermosetting resin, thermoplastic resin, or a composite of thermosetting and thermoplastic resins.

More preferably for this embodiment, the interlaminar insulative resin layer should be formed from a composite of thermosetting and thermoplastic resins.

The thermosetting resin may be a one selected from epoxy resin, polyimide resin, phenol resin, thermosetting polyphenylether (PPE), etc.

The thermoplastic resin may be a one selected from fluororesins such as polytetrafluoroethylene (PTFE), polyethylene terephthalate (PET), polysulfone (PSF), polyphenylene sulfide (PPS), thermoplastic polyphenylene ether (PPE), polyether sulfone (PES), polyether imide (PEI), polyphenylene sulfon (PPES), tetrafluoroethylene hexafluoropropylene copolymer (FEP), tetra fluoroethylene perfluoroalkoxy copolymer (PFA), polyethylene naphthalate (PEN), polyether ether ketone (PEEK), polyolefin, etc.

The composite of thermosetting and thermoplastic resins may be a composite of epoxy resin with PES, PSF, PPS or PPES, or similar.

This embodiment should preferably use a composite of a fluororesin fiber cloth and a thermosetting resin charged in voids in the cloth since the composite shows a low dielectric constant and high dimensional stability.

In this case, the thermosetting resin should preferably be at least a one selected from epoxy resin, polyimide resin, polyimide resin and phenol resin.

The fluororesin fabric cloth should preferably be a texture or nonwoven fabric made from the fluororesin fibers. The nonwoven fabric is produced by forming a sheet from short or long fluororesin fibers and a binder and heating the sheet to fuse the fibers to each other.

Also, this embodiment of the present invention can use an adhesive for use in the electroless plating as the interlaminar insulative resin layer.

The electroless plating adhesive should optimally be prepared by dispersing cured heat-resistant resin particles soluble in acid or oxidizing agent into a non-cured heat-resistant resin which will be made insoluble in acid or oxidizing agent by curing. This electroless plating adhesive is most suitably usable because the heat-resistant resin particles can be dissolved and removed in the presence of an acid or oxidant to have formed thereon a roughened surface which can securely anchor an adjoining layer.

The electroless plating adhesive, namely, the cured heat-resistant resin particles, should preferably be at least a one selected from a heat-resistant resin powder of 10 μm or less in mean particle size, agglomerate produced by coagulating heat-resistant resin particles of 2 μm or less in mean particle size, mixture of a heat-resistant resin powder of 2 to 10 μm or less in mean particle size and a heat-resistant resin powder of 2 μm or less in mean particle size, dummy particles produced by depositing at least a one selected from a heat-resistant resin powder or inorganic powder of 2 μm or less in mean particle size on the surface of a heat-resistant resin powder of 2 to 10 μm in mean particle size, mixture of a heat-resistant resin powder of 0.1 to 0.8 μm in mean particle size and a heat-resistant resin powder of over 0.8 μm and under 2 μm in mean particle size, and a heat-resistant resin powder of 0.1 to 1.0 μm in mean particle size. This electroless plating adhesive can be used to form a more complicated anchoring surface.

The heat-resistant resin used in the electroless plating adhesive may be any one of the aforementioned thermosetting resin, thermoplastic resin and composite of thermosetting and thermoplastic resins. Particularly, the composite of thermosetting and thermoplastic resins is optimally usable for this embodiment of the present invention.

The multilayer printed wiring board according to the first embodiment of the present invention has been described in the foregoing. This printed wiring board is manufactured as will be described herebelow with reference to FIGS. 1 and 2.

(1) First, a wiring substrate is prepared by forming on either side of a core substrate 1 an inner conductor circuit pattern 2 (as in FIG. 1(a)).

The core substrate 1 is a laminate coppered on either side thereof. The inner conductor circuit pattern 2 is formed by etching the copper layer on either side of the core substrate 1. Alternatively, the core substrate 1 may be a glass epoxy substrate, polyimide substrate, ceramic substrate, or a metal substrate. In this case, the inner conductor pattern 2 is provided on the core substrate 1 by forming an electroless plating adhesive layer on the core substrate 1, roughening the adhesive layer surface and by plating the roughened surface with a metal by the electroless plating method. Otherwise, the inner conductor pattern 2 is provided on the core substrate 1 by the semi-additive method. More particularly, the entire roughened surface of the electroless plating adhesive layer is electroless-plated, a plating resist is applied selectively on the roughened surface, a surface portion not applied with the plating resist is electroplated, then the plating resist is removed, and the entire surface is etched, thereby producing the conductor circuit pattern 2 consisting of electroplating and electroless plating layers.

Further, a layer 3 having a roughed surface is formed as necessary on the surface of the inner conductor circuit pattern 2 on the wiring substrate as shown in FIG. 1(b). The roughed surface layer 3 is made of copper, nickel and phosphorus.

The roughed surface layer 3 is formed by electroless plating. The aqueous electroless plating solution should preferably have a copper ion concentration of $2.2\times10^{-2}$ to $4.1\times10^{-2}$ mol/l, nickel ion concentration of $2.2\times10^{-3}$ to $4.1\times10^{-3}$ mol/l and a hypophosphorus ion concentration of 0.20 to 0.25 mol/l.

A layer thus precipitated from the electroplating solution will have a needle crystalline structure which provide an excellent anchorage. In the electroless plating solution, a complex and additive may be added to the above-mentioned compound.

The surface of the layer 3 is roughened by an electroless copper-nickel-phosphorus plating, oxidizing and reducing, etching the copper surface along the grain boundary, or otherwise, as described in the above.

Note that the core substrate 1 has formed therein through-holes through which the inner conductor circuit patterns 2 on the opposite sides of the core substrate 1 are electrically connected to each other.

Also the through-holes and spaces between the conductor circuit patterns 2 may be filled with a resin to assure a surface flatness.

(2) Next, an interlaminar insulative resin layer 4 is formed on either side of the wiring substrate prepared at the above step (1) (as in FIG. 1(c)).

Particularly, for the first embodiment of the present invention, the interlaminar insulative resin layer 4 in which via-holes 9 are to be formed as will further be discussed later should preferably be an electroless plating adhesive containing as resin matrix a composite of a thermosetting resin and thermoplastic resin.

(3) After the interlaminar insulative resin layer or electroless plating adhesive layer 4 formed at the above step (2) is dried, holes 5 for the viaholes are formed in the layer 4 (as in FIG. 1(d)).

In case the resin of the interlaminar insulative layer 4 is a photosensitive one, the hole 5 is formed by exposing, developing and then thermally curing the layer 4. When the resin is a thermosetting one, the hole 5 is formed by thermally curing the layer 4 and then Laser drilling. At this time, the ratio $D/T_1$ between the viahole diameter (D) and interlaminar insulative resin layer thickness ($T_1$) should preferably be within a range of 1 to 4. This is because if the ratio $D/T_1$ is less than 1, the electroplating solution will not enter the hole while the ratio over 4 will not allow the hole to be filled with a plating metal sufficiently.

(4) Next, the epoxy resin particles existent on the surface of the cured adhesive layer 4 are removed by decomposing or dissolving with an acid or oxidant to rough the surface of the adhesive layer 4. Thus a roughened or rough surface 6 is formed. (Also see FIG. 1(e).)

The acid used for this purpose should preferably be a one selected from phosphoric acid, hydrochloric acid, sulfuric acid and an organic acid such as formic acid or acetic acid. It should more preferably be an organic acid for it will not attack a metallic conductor layer exposed out of the viahole when the surface of the adhesive layer 4 is roughened.

The oxidant should preferably be chromic acid, or permanganic acid (such as potassium permanganate).

(5) Next, a catalyst nucleus is applied to the roughened surface 6 of the adhesive layer 4.

The catalyst nucleus should preferably be a precious metal ion or colloid. Generally, it is a palladium chloride or palladium colloid. More preferably, it should be a palladium. To fix the catalyst nucleus, it is heated.

(6) Further, the roughened surface 6 of the electroless plating adhesive layer 4 is electroless plated to form an electroless plating layer 7 of which the surface is correspondingly rough to the roughened surface 6 (as in FIG. 1(*f*)). The electroless plating layer 7 should be 0.1 to 5 μm thick, and more preferably 0.5 to 3 μm.

Figure 2:
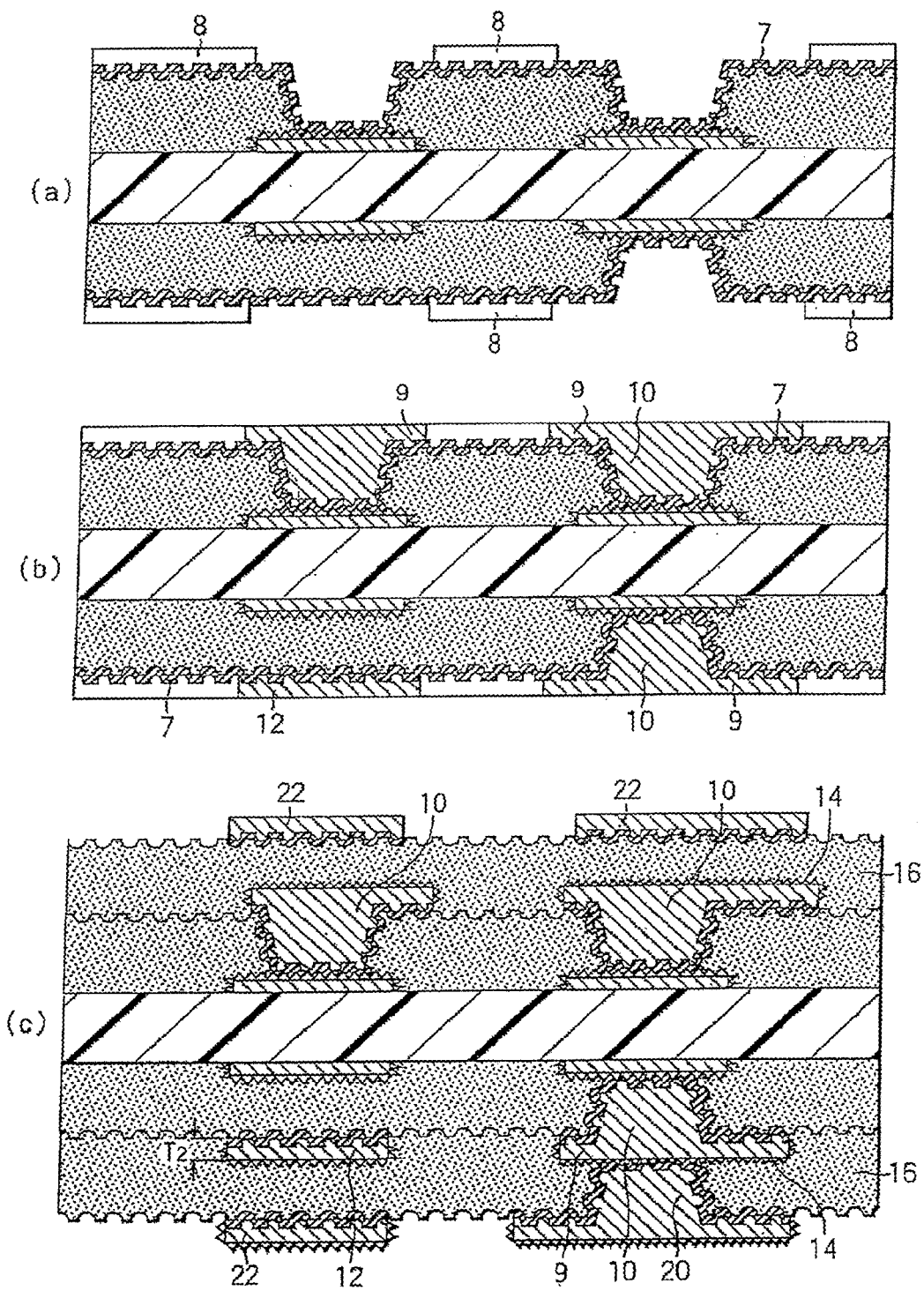
FIGS. 2(a)-2(c) show further steps included in the process of manufacturing the first example of multilayer printed wiring board according to the present invention.

Next, a plating resist layer 8 is formed on the electroless plating layer 7 (as in FIG. 2(*a*)). The plating resist should preferably be composed of an acrylate of a cresol novolac type epoxy resin or phenol novolac type epoxy resin, and an imidazole curing agent. It may a commercially available dry film.

(7) Further, a surface portion of the electroless plating layer 7 on which the plating resist layer is not formed is electroplated to form a conductor layer on which an upper conductor circuit 12 is to be formed, and an electroplating layer 9 is filled in the hole 5 to form a viahole 10 (as in FIG. 2(*b*)). At this time, the electroplating layer 9 exposed out of the hole 5 should preferably be 5 to 30 μm thick so that the upper conductor circuit 12 will have a thickness $T_2$ not exceeding a half of the diameter D of the viahole ($T_2 < D/2$).

For the electroplating, copper plating should preferably be used.

(8) Furthermore, the plating resist layer 8 is removed, and then the electroless plating layer under the plating resist is dissolved and removed in a mixed solution of sulfuric acid and hydrogen peroxide or an etchant of sodium persulfate or ammonium persulfate to provide an independent upper conductor circuitry layer 12 and filled viahole 10.

(9) Next, the surface of the upper conductor circuitry layer 12 is roughened to form a roughened surface 14.

The roughened surface 14 may be formed by etching, polishing, oxidizing and reducing, or plating.

First for oxidation and reduction, respectively, an oxidation bath is prepared from 20 g/l of NaOH, 50 g/l of $NaClO_2$ and 15.0 g/l of $NaPO_4$ and a reduction bath is prepared from 2.7 g/l of NaOH and 1.0 g/l of $NaBH_4$.

If the roughed surface layer 14 is made of an alloy of copper-nickel-phosphorus, the alloy is precipitated by an electroless plating.

As an electroless plating solution for this alloy, a reduction bath should preferably be used which is composed of 1 to 40 g/l of copper sulfate, 0.1 to 6.0 g/l of nickel sulfate, 10 to 20 g/l of citric acid, 10 to 100 g/l of hypophosphite, 10 to 40 g/l of boric acid and 0.01 to 10 g/l of surfactant.

Further, the rough surface layer 14 is covered with a layer of a metal or a precious metal of which the ionization tendency is larger than that of copper and smaller than that of titanium.

For covering the roughened surface layer 14 with tin, a solution of tin boronfluoride and thiocarbamide, or a solution of tin chloride and thiocarbamide, should be used. In this case, an Sn layer of 0.1 to 2 μm or so in thickness is formed as a result of Cu—Sn substitution.

For covering the roughened surface layer 14 with a precious metal, spattering or evaporation may be adopted.

(10) Next, an electroless plating adhesive layer 16 is formed, as an interlaminar insulative resin layer, on the wiring substrate having been processed.

(11) Further, the steps (3) to (8) are repeated to provide a further viahole 20 just on the viahole 10 and a further upper conductor circuitry layer 22 above the upper conductor circuit 12. The surface of the further viahole 20 is formed as a conductor pad which functions as a solder pad.

(12) Next, a solder resist composition is applied to the outer surface of the wiring substrate having been processed as in the foregoing. After the solder resist layer is dried, a photomasking film having a hole pattern depicted thereon is placed on the solder resist layer. The solder resist layer is exposed and developed to form holes in which the solder pad portion (including conductor pad and viahole) of the conductor layer is exposed. The opening diameter of the exposed hole may be larger than the diameter of the solder pad so that the solder pad will be exposed. Alternatively, the opening diameter of the hole may be smaller than the diameter of the solder pad so that the edge of the solder pad will be covered with the solder resist layer. In the latter case, the solder pad can be retained under the solder resist layer, and thus it can be prevented from being separated.

(13) Next, metal layers of "nickel and gold", respectively, are formed on the solder pad exposed out of the hole.

The nickel layer should preferably be 1 to 7 μm thick, and the gold layer be 0.01 to 0.06 μm thick for a thicker nickel layer will increase the resistance while a smaller thickness of the nickel layer will render itself easily separable. Concerning the gold layer, a larger thickness will lead to an increased manufacturing cost while a smaller thickness will lower the adhesion to the solder layer.

(14) Next, a solder is fed onto the solder pad exposed out of the hole to produce a 6-layered printed wiring board. The solder is fed by the solder transfer or printing method.

In the solder transfer method, a solder foil is attached to a prepreg, and the solder foil is etched with only a portion thereof corresponding to the hole to form a solder pattern which will be a solder carrier film. After a flux is applied to the hole in the solder resist on the substrate, the solder carrier film is attached on the flux and heated to transfer the solder.

On the other hand, in the solder printing method, a printing mask (metallic) having through-holes formed in positions corresponding to the solder pads is placed on the wiring substrate and a solder paste is printed on the mask and heated.

In the printed wiring board according to the first embodiment, a solder bump is formed on the filled viahole. In the conventional printed wiring board, since the viahole is not filled, a larger amount of solder paste is required to form a solder bump as high as a solder bump of a flat solder pad. Namely, the hole in the printing mask has to be large. According to this embodiment of the present invention, however, since the viahole is filled, the solder paste may be applied in a uniform amount and the holes in the printing mask may have a same size.

(B) Next, the second embodiment of the present invention will further be discussed herebelow. In a multilayer printed wiring board having conductor circuitry layers and interlaminar insulative resin layers deposited alternately one on another, the interlaminar insulative resin layers having formed through them holes each filled with a plating layer to form a viahole, according to the second embodiment, the thickness of the conductor circuitry layer is less than a half of the viahole diameter and less than 25 μm.

In the filled viahole structure of the printed wiring board according to the second embodiment, the thickness of the plating conductor forming the conductor circuitry layer can be less than the half of the viahole and less than 25 μm. Thus, there can be formed a thinner plating resist having an improved resolution, which makes it possible to easily form the conductor circuitry layer by etching and pattern an ultra-fine circuit.

Further, since the conductor circuitry layer has the thickness less than the half of the opening diameter of the viahole and less than 25 μm, the area of contact of the edge of the conductor circuitry layer with the interlaminar insulative resin layer is reduced correspondingly. Therefore, the central portion of the viahole surface should preferably be depressed and roughened, whereby the adhesion between the conductor layer and interlaminar insulative resin layer can be improved and thus separation between them can be prevented. More specifically, a stress developed due to heat cycle can be dispersed so that the conductor and insulative layers can be prevented from being separated from each other.

The aforementioned second embodiment should preferably be constructed as will be described herebelow:

① The filled viahole and inner conductor circuitry layer (inner pad) are electrically connected to each other by a roughened surface layer provided on the surface of the inner conductor circuitry layer to improve the adhesion between the viahole and inner conductor circuit.

② The filled viahole and conductor circuitry layer has their surfaces roughened to improve the adhesion between them and the outer interlaminar insulative resin layer.

③ The conductor circuitry layer has also an edge thereof roughened.

④ The roughened surface layer on the surface of the conductor circuitry layer is 1 to 10 μm thick.

⑤ The surface roughing is done as in the first embodiment.

⑥ A further viahole is formed on the filled viahole.

⑦ The surface including the inner wall of the interlaminar insulative resin layer is roughened.

⑧ The interlaminar insulative resin layer is made of a thermosetting resin, thermoplastic resin, or a composite of thermosetting and thermoplastic resins, and preferably of the composite of thermosetting and thermoplastic resins or the thermoplastic resin.

The thermosetting resin, thermoplastic resin and composite of thermosetting and thermoplastic resins may be selected from those having previously been described concerning the first embodiment, and so they will not be discussed any longer.

Next, the multilayer printed wiring board having the aforementioned filled viahole structure according to the second embodiment are manufactured as will be described below with reference to FIGS. 1 and 2.

The manufacturing process is substantially same as that for the first embodiment and thus includes the previously mentioned steps (1) to (14).

At the step (7), when electroplating the portion not applied with the plating resist with a conductor layer which will form a conductor circuit, and filling a plating layer into the hole to form the viahole, the electroplating layer should preferably be formed to a thickness of 5 to 20 μm so that the conductor circuitry layer has a thickness less than a half of the viahole diameter and less than 25 μm.

(C) Next, the third embodiment of the present invention will be described. In a multilayer printed wiring board formed from conductor circuitry layers and interlaminar insulative resin layers deposited alternately one on another, the interlaminar insulative resin layers having formed through them holes each filled with a plating layer to form a viahole, according to the third embodiment, the inner wall of the hole formed in the interlaminar insulative resin layer is roughened, the roughened inner wall of the hole is covered with a roughened electroless plating layer, and an inner space of the hole defined by the electroless plating layer is filled with an electroplating layer.

In the filled viahole structure of the multilayer printed wiring board according to the third embodiment, the electroless plating layer harder than the electroplating layer is formed over the inner Wall of the hole. The electroless plating layer bites, like anchor, the roughened surface, so it is not easily broken even when a separating force is applied, and the adhesion between the viahole and interlaminar insulative resin layer is improved. Also, since the electroplating layer having a larger malleability than the electroless plating layer fills the major part of the hole, the electroplating layer will flexibly follow the expansion and shrinkage of the interlaminar insulative resin layer, thus the layers can be prevented from being cracked under a thermal shock or due to heat cycle.

Since the inner wall of the hole in the interlaminar insulative resin layer is roughened, there is provided an improved adhesion between the viahole and interlaminar insulative resin layer. The electroless plating layer formed on the roughened surface is so thin as to follow the irregularity of the roughened surface. This surface irregularity serves as anchor to provide a strong adhesion to an electroplating layer. Therefore, the electroless plating layer and electroplating layer will not be separated from each other even due to heat cycle or under a thermal shock.

Other surface than the hole inner wall is also roughened, the roughened surface is electroless plated, and further a plating resist is applied to the electroless plating layer. The plating resist applied on the roughened surface will close adhere to the irregular surface of the electroless plating layer, and thus it will not easily be separated from the electroless plating layer surface. Therefore, there will not arise a short-circuit between the conductor circuitry layers in the process of manufacturing the printed wiring board by the semi-additive method.

The electroless plating layer forming the above-mentioned conductor circuit should preferably be 0.1 to 5 μm, and more preferably 1 to 5 μm for a thickness too larger than 5 μm will not assure to sufficiently follow the shape of the roughened surface of the interlaminar insulative resin layer while a thickness too smaller than 1 μm will lower the separating or peeling strength and cause a large resistance which will interfere with a subsequent electroplating, so that the plating layer thickness will not be uniform.

The electroplating layer forming the conductor circuit should preferably have a thickness within a range of 5 to 30 μm, and more preferably a thickness ranging from 10 to 20 μm. This is because a larger thickness will cause the peeling strength to be lower while a smaller thickness will increase the resistance, so that the electroplating will result in an uneven precipitation.

Next, the multilayer printed wiring board having the aforementioned filled viahole structure according to the third embodiment is manufactured as will be discussed herebelow with reference to FIGS. 1 and 2.

The manufacturing process is substantially same as that for the first embodiment and thus includes the previously mentioned steps (1) to (14).

At the step (7) among others, when electroplating the portion not applied with the plating resist with a conductor layer which will form a conductor circuit, and filling a plating layer into the hole to form the viahole, the electroplating layer should preferably be 5 to 20 μm thick so that the conductor circuitry layer is less than a half of the viahole diameter.

Further according to this embodiment, the plating solution composition, plating temperature, dipping length of time and agitating conditions should preferably be controlled to depress the central portion of the plating layer exposed out of the hole that forms the viahole. The depression should preferably have a size less than the thickness of the conductor layer, and more preferably be 20 μm or less. This is because a bigger depression will result in a larger thickness of the interlaminar insulative resin layer formed on the depression than that of the resin layer formed on the other conductor layers.

When the resin layer is exposed, developed and lased, it is likely to partially remain on the depression in the viahole, which will lower the electrical connection reliability of the viahole.

(D) Next, the fourth embodiment of the present invention will further be discussed herebelow. In a multilayer printed wiring board formed from conductor circuitry layers and interlaminar insulative resin layers deposited alternately one on another, the interlaminar insulative resin layers having formed through them holes each filled with a plating layer to form a viahole, according to the fourth embodiment, the interlaminar insulative resin layer is formed from a composite of fluororesin and heat-resistant thermoplastic resin, composite of fluororesin and thermosetting resin, or a composite of thermosetting resin and heat-resistant resin.

In the filled viahole structure of the fourth embodiment discussed above, the interlaminar insulative resin layer in which the viahole is provided is formed from a highly tough composite of fluororesin and heat-resistant thermoplastic resin, or a highly tough composite of fluororesin and thermosetting resin. So, even if the viahole is made from a hole filled with a plating layer, since the metal layer is thermally expanded during heat cycle, no crack will develop first at the viahole. Also, the fluororesin has so low a dielectric constant that signal will be propagated with no delay.

In this embodiment, the interlaminar insulative resin layer in which the viahole is formed should preferably be formed from a composite of fluororesin and heat-resistant thermoplastic resin, or a composite of fluororesin and thermosetting resin.

The fluororesin should preferably be a polytetrafluoroethylene since it is a most versatile fluororesin.

The heat-resistant thermoplastic resin should preferably be a one which can be thermally decomposed at a temperature higher than 250° C. and that is selected from fluororesins such as polytetrafluoroethylene (PTFE), polyethylene terephthalate (PET), polysulfone (PSF), polyphenylene sulfide (PPS), thermoplastic polyphenylene ether (PPE), polyether sulfone (PES), polyether imide (PEI), polyphenylene sulfon (PPES), tetrafluoroethylene hexafluoropropylene copolymer (FEP), tetrafluoroethylene perfluoroalkoxy copolymer (PFA), polyethylene naphthalate (PEN), polyether ether ketone (PEEK), polyolefin, etc.

The thermosetting resin may be epoxy resin, polyimide resin, phenol resin, thermosetting polyphenylene ether (PPE), or similar.

The composite of fluororesin and thermosetting resin should preferably be a composite of fluororesin fabric cloth and thermosetting resin charged in voids in the cloth.

In this case, the a fluororesin fabric cloth should preferably be a texture or nonwoven fabric made from the fluororesin fibers. The nonwoven fabric is produced by forming a sheet from short or long fluororesin fibers and a binder and heating the sheet to fuse the fibers to each other.

Further, the thermosetting resin should preferably be at least a one selected from epoxy resin, polyimide resin, polyamide resin and phenol resin. The composite of thermosetting and thermoplastic resins may be a composite of epoxy resin with PES, PSF, PPS or PPES, or similar.

Figure 3:
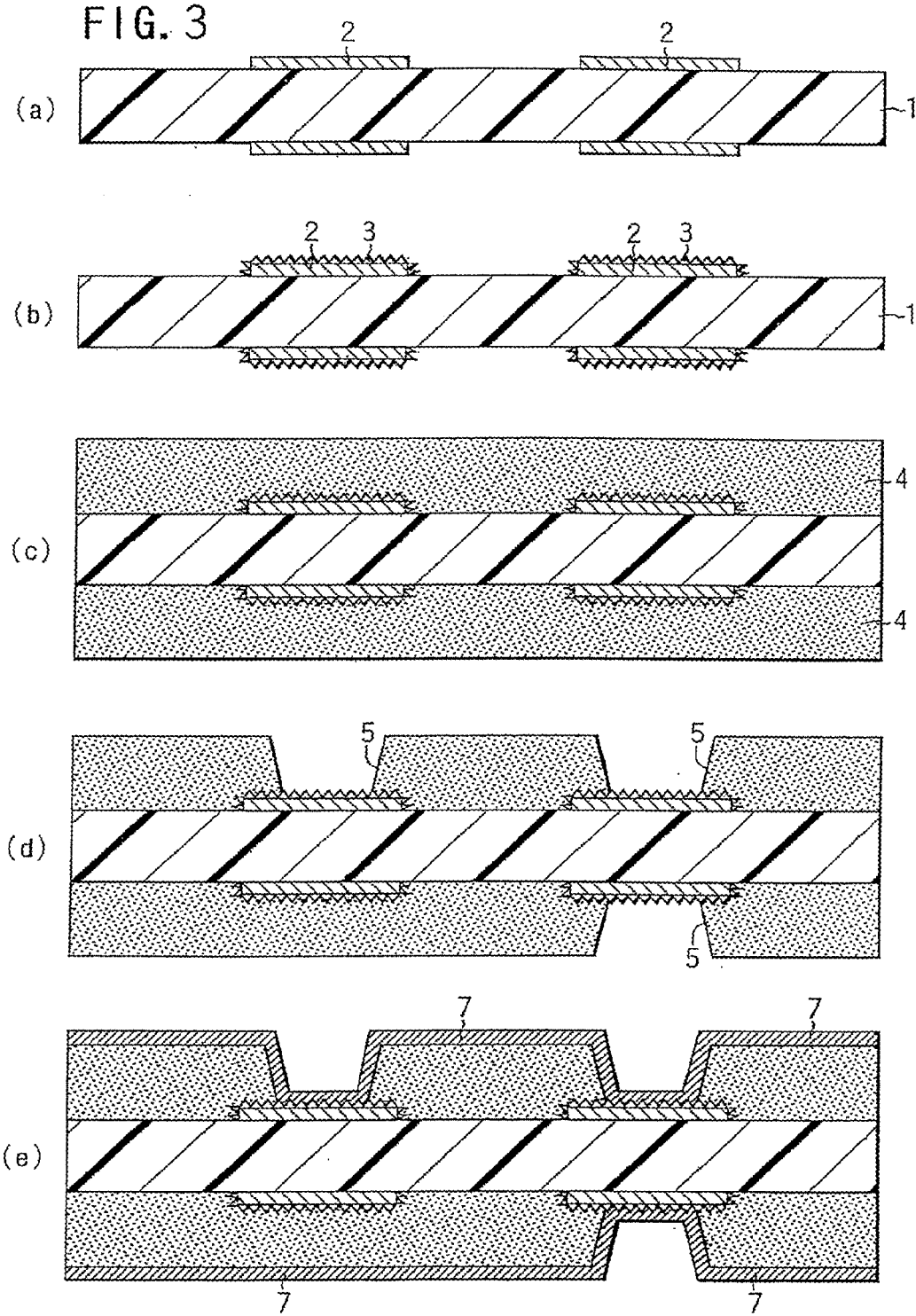
FIGS. 3(a)-3(e) show various steps included in the process of manufacturing the eighth example of multilayer printed wiring board according to the present invention.
Figure 4:
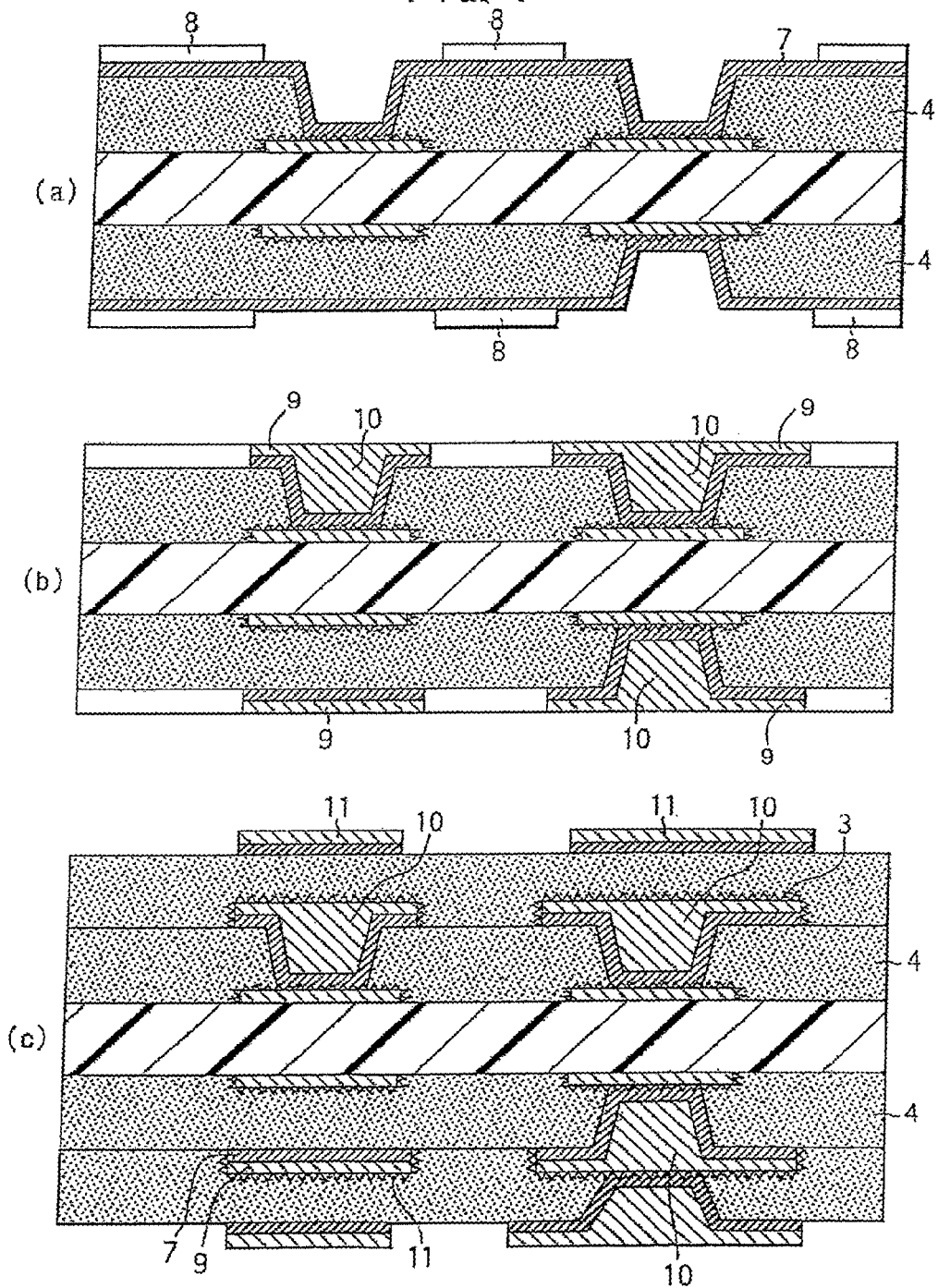
FIGS. 4(a)-(4c) show further steps included in the process of manufacturing the eighth example of multilayer printed wiring board according to the present invention.

The multilayer printed wiring board according to the fourth embodiment is manufactured as will be described herebelow with reference to FIGS. 3 and 4.

The manufacturing process is substantially same as that for the first embodiment and thus includes the previously mentioned steps (1) to (14).

At the step (2), a composite of fluororesin and heat-resistant thermoplastic resin, composite of fluororesin and thermosetting resin or a composite of thermosetting and thermoplastic resins is used as the interlaminar insulative resin layer. Particularly, an electroless plating adhesive using the composite as resin matrix should preferably be used.

At the step (3), after the electroless plating adhesive is dried, holes for the viaholes are formed in the layer.

In case the interlaminar insulative layer is made of a resin photosensitized by acrylating, the hole for the viahole is formed by exposing, developing and then thermally curing the resin layer. When the resin is a composite of fluororesin and heat-resistant thermoplastic resin, composite of fluororesin and thermosetting resin or a composite of thermosetting and thermoplastic resins, the hole for the via hole is formed by thermosetting the resin layer and then by lasing drilling. At this time, the ratio $D/T_1$ between the viahole diameter (D) and interlaminar insulative resin layer thickness ($T_1$) should preferably be within a range of 1 to 4. This is because if the ratio $D/T_1$ is less than 1, the electroplating solution will not enter the hole while the ratio over 4 will not allow the hole to sufficiently be filled with a plating metal.

Further at the step (4), the surface of the interlaminar insulative resin layer should preferably be roughened by plasma etching or the like for this roughening will improve the adhesion to the plating layer.

In case an electroless plating adhesive is used as the interlaminar insulative resin layer, the epoxy resin particles existent on the surface of the cured adhesive layer are removed by decomposing or dissolving with an acid or oxidant to rough the surface of the adhesive layer.

EXAMPLES

To confirm the advantages of the aforementioned first to fourth preferred embodiments of the present invention, examples 1 to 9 and comparative examples 1 to 8 of multilayer printed wiring boards were prepared through the steps (1) to (11) of the 14 steps having been described in the foregoing, not yet including the step at which the solder bump is formed. Example 11 was prepared through all the steps (1) to (14). The multilayer printed wiring boards thus prepared will further be described in detail herebelow:

Example 1

(1) Compositions prepared through the following steps ① to ③ were mixed together and agitated to prepare an electroless plating adhesive.
  ① Thirty-five parts by weight of a 25% acrylated product of cresol novolac type epoxy resin (80% in sold content; 250 in molecular weight, by Nippon Kayaku Co., Ltd.), 4 parts by weight of photosensitive monomer (ARONIX M315 by Toa Gosei Co., Ltd.), 0.5 part by weight of antifoaming agent (S-65 by SANNOPCO) and 3.6 parts by weight of NMP, were mixed by agitation.
  ② Eight parts by weight of polyether sulfone (PES) and 7.245 parts by weight of epoxy resin particles (POLYMERPOE by Sanyo Kasei Co., Ltd.) of 0.5 μm in mean particle size were mixed together and then 20 parts by weight of NMP were added to the mixture. They were mixed by agitation.
  ③ Two parts by weight of imidazole curing agent (2E4MZ-CN by Shikoku Kasei Co., Ltd.), 2 parts by weight of initiator (IRGACURE I-907 by Ciba Geigy), 0.2 part by weight of photosensitizer (DETX-S by Nippon Kayaku Co., Ltd.) and 1.5 parts by weight of NMP were mixed together by agitation.

(2) A substrate 1 made of bismaleimide triazine (BT) and having a conductor circuitry layer 2 formed on either surface thereof (as in FIG. 1(a)) was dipped in an electroless plating solution composed of 8 g/l of copper sulfide, 0.6 g/l of nickel sulfide, 15 g/l of citric acid, 29 g/l of sodium hypophosphite, 31 g/l of boric acid and 0.1 g/l of surfactant and having a pH of 9 to precipitate a roughened surface layer 3 of copper, nickel and phosphorus to a thickness of 3 μm on the surface of the conductor circuitry layer 2. Then, the substrate 1 was washed in water. It was dipped in an electroless tin-substitution plating bath composed of 0.1 mol/l of tin boron-fluoride and 1.0 mol/l of thiocarbamide at 50° C. for 1 hour to precipitate a tin layer of 0.3 μm on the surface of the roughened surface layer 3 (as in FIG. 1(b); the tin layer is not illustrated).

(3) The interlaminar insulative resin layer prepared at the above step (1) was applied to the substrate 1 (see FIG. 1(c)). After the substrate 1 was dried, a photomasking film was placed on the substrate 1, exposed, developed and thermally cured to form a 20 μm-thick interlaminar insulative resin layer 4 having formed through them holes 5 for viaholes of which the diameter is 60 μm (61 μm at bottom and 67 μm at top) (see FIG. 1(d)).

(4) The substrate 1 having the interlaminar insulative resin layer 4 formed thereon was dipped in chromic acid for 19 min to form a roughed surface layer 6 of 4 μm in depth on the surface of the layer 4 (see FIG. 1(e)).

(5) The substrate 1 having the rough surface layer 6 formed thereon was dipped in an electroless plating solution to form an electroless plating layer 7 of 0.6 μm in thickness over the rough surface (see FIG. 1(f)).

(6) A plating resist layer 8 was formed on the electroless plating layer 7 in the conventional manner (see FIG. 2(a)).

(7) Next, a portion on which the plating resist layer 8 was not formed was electroplated under the following conditions to form an electroplating layer 9 of 20 μm in thickness on the portion. The layer 9 provided a conductor layer on which a conductor circuit 12 was to be formed, and the electroplating layer 9 was filled in the hole to form a viahole 10 (as in FIG. 2(b)).

Aqueous Electroplating Solution:

| | |
|---|---|
| $CuSO_4 \cdot 5H_2O$ | 60 g/l |
| Leveling agent (HL by ATOTTECH) | 40 ml/l |
| Sulfuric acid | 190 g/l |
| Brightening agent (UV by ATOTTECH) | 0.5 ml/l |
| Chlorine ion | 40 ppm |

Electroplating Conditions:

| | |
|---|---|
| Bubbling | 3.0 liters/min |
| Current density | 0.5 A/dm$^2$ |
| Set current value | 0.18 A |
| Plating length of time | 130 min |

(8) The plating resist layer 8 was separated and removed, and then the electroless plating layer 7 under the plating resist layer 8 was dissolved for removal in an etching solution composed of a mixture of sulfuric acid and hydrogen peroxide, sodium persulfate, ammonium persulfate, etc. to form the conductor circuit 12 consisting of the electroless plating layer 7 and electroplating copper layer 9 and of which the thickness is about 20 μm and L/S ratio is 25/25 μm. At this time, the viahole 10 had a flat surface and the conductor circuit surface and viahole surface were at a same level.

The inventors of the present invention found that when the thickness T of the interlaminar insulative resin layer 4 was 20 μm while the viaholes 10 were formed to have diameters D of 25, 40, 60 and 80 μm, the plating layers required for filling the viaholes 10 were 10.2, 11.7, 14.8 and 23.8 μm thick, respectively.

(9) As at the step (2), a roughened surface layer 3 was formed on the substrate. Further, the steps (3) to (8) were repeated to produce a multilayer printed wiring board (as in FIG. 2(c)).

Example 2

A multilayer printed wiring board was prepared in the same manner as the aforementioned example 1 except that an interlaminar insulative resin layer was formed by attaching a fluororesin film of 20 μm in thickness to the layer by thermocompression bonding and holes for viaholes of 60 μm in diameter were formed by irradiating ultraviolet laser.

Example 3

(1) A drawn tetrafluoroethylene resin (PTFE) fiber available as fiber for woven fabric from the W. L. Gore & Associates, Inc. (trade name: GORE-TEX) was used to weave a cloth for an interlaminar insulative resin layer. The cloth was composed of 53 fibers of 400 deniers per 2.54 cm in longitudinal direction and 52 fibers of 400 deniers per 2.54 cm in lateral direction.

(2) The fluororesin fiber cloth was cut to a sheet of 15.24 cm by 15.24 cm, and the cloth sheet was immersed in a solution of alkaline metal and naphthalene available under the trade name TETRA-ETCH from the W. L. Gore & Associates. After that, the cloth sheet was washed in warm water to rinse away the acetone. The fibers appeared dark brown due to the etching and the cloth shrank 20% in both longitudinal and lateral directions. The cloth sheet was stretched to the initial dimensions with the edges thereof held in hands.

On the other hand, a liquid epoxy resin was prepared as a thermosetting resin which was to be impregnated into the fluororesin fiber cloth according to the guide line stated in the Dow Chemical's Products Catalog No. 296-396-783 for Dow epoxy resin products 521-A80.

(3) The liquid epoxy resin was impregnated into the fluororesin fiber cloth prepared at the above step (2). The fluororesin fiber cloth impregnated with the epoxy resin was dried at 160° C. to provide a B-stage sheet. The sheet was 0.3556 cm in thickness and the impregnated resin in the sheet weighed 5 g.

(4) The B-stage sheet was attached on the substrate at the step (2) for the example 1, and pressed under a pressure of 80 kg/cm$^2$ at 175° C. to form an interlaminar insulative resin layer. Further, the layer was exposed to an ultraviolet laser of 220 nm in wavelength to form holes for viaholes of 60 μm in diameter. Thereafter, the steps (4) to (9) for the example 1 was repeated to produce a multilayer printed wiring board.

Comparative Example 1

As disclosed in the Japanese unexamined patent publication No. Hei 2-188992, a multilayer printed wiring board was produced in the same manner as the aforementioned example 1 except that a conductor circuit was made only of an electroless plating layer of 25 μm in thickness and viaholes were formed by dipping for 11 hours in en electroless plating aqueous solution composed of 0.06 mol/l of copper sulfide, 0.3 mol/l of formalin, 0.35 mol/l of NaOH, 0.35 mol/l of EDTA and a small amount of additive at 75° C. and having a pH of 12.4.

In the wiring board, the holes in the interlaminar insulative resin layer were found filled with the plating layer, but a depression of 20 to 25 m was found in the central portion of the plating layer.

Comparative Example 2

According to the disclosure in the Japanese unexamined patent publication No. Hei 2-312472, a multilayer printed wiring board was produced. More particularly, the steps (1) to (5) for the embodiment 1 were repeated to process a substrate and then the substrate was dipped in an electroless plating solution prepared from an aqueous solution composed of 0.05 mol/l of copper sulfide, 0.30 mol/l of formalin, 0.35 mol/l of sodium hydroxide, and 0.35 mol/l of ethylenediaminetetraacetic acid (EDTA) to form a plating layer of 40 μm in thickness.

Further, a dry film was attached to the substrate, exposed and developed to form an etching resist of L/S=25/25 μm on the substrate. For etching, the substrate was dipped in a mixed solution of sulfuric acid and hydrogen peroxide. However, the conductor circuitry layer was undercut and separated. Therefore, the comparative example 2 was not evaluated.

The examples 1 to 3 and comparative example 1 were evaluated as to ① surface flatness of their interlaminar insulative resin layer and ② electrical connection reliability of the viahole.

The above item ①, surface flatness, was evaluated by judging whether a depression developed on a first applied interlaminar insulative resin layer. The item ②, electrical connection reliability of the viahole, was evaluated by checking, using a probe, whether a further viahole formed on a viahole already formed showed a poor electrical continuity. The evaluation results are shown in Table 1.

As seen from Table 1, the examples 1, 2 and 3 are superior in surface flatness of the interlaminar insulative resin layer. Even when the further viahole is provided on the inner one, a circuit pattern breaking due to a depression is not observed, namely, the examples

TABLE 1

|  | Depression on interlaminar insulative resin layer | Poor electrical continuity |
| --- | --- | --- |
| Example 1 | No | No |
| Example 2 | — | No |
| Example 3 | — | No |
| Comparative example 1 | Yes | No |

1 to 3 have a high electrical connection reliability of the viahole, and IC chip and other devices can easily be mounted on the wiring boards with no inconvenience. Further, even when mass-produced, the examples 1 to 3 will show a high electrical connection reliability of the viaholes.

Owing to the structure of the examples 1 to 3, a fine circuit pattern of L/S=25/25 μm can be formed.

As mentioned above, the first embodiment of the present invention provides a multilayer printed wiring board having a filled viahole structure enabling a fine circuit pattern to be formed and showing superior surface flatness and high electrical connection reliability of the viahole.

Example 4

A multilayer printed wiring board was produced by repeating the steps (1) to (5) for the example 1, and further processing the substrate as follows:

(6) A plating resist layer 8 of 15 μm in thickness and L/S=25/25 μm was formed on the electroless plating layer 7 in the conventional manner (see FIG. 2(*a*)).

(7) Next, a portion on which the plating resist layer 8 was not formed was electroplated under the following conditions to form an electroplating layer 15 μm in thickness on the portion. The layer 9 provided a conductor layer on which a conductor circuit was to be formed, and the electroplating layer 9 was filled in the hole to form a viahole 10 (as in FIG. 2(*b*)).

Aqueous Electroplating Solution:

| $CuSO_4 \cdot 5H_2O$ | 60 g/l |
| --- | --- |
| Leveling agent (HL by ATOTTECH) | 40 ml/l |
| Sulfuric acid | 190 g/l |
| Brightening agent (UV by ATOTTECH) | 0.5 ml/l |
| Chlorine ion | 40 ppm |

Electroplating Conditions:

| Bubbling | 3.0 liters/min |
| --- | --- |
| Current density | 0.5 A/dm$^2$ |
| Set current value | 0.18 A |
| Plating length of time | 100 min |

(8) The plating resist layer 8 was separated and removed, and then the electroless plating layer 7 under the plating resist layer 8 was dissolved for removal in an etching solution composed of a mixture of sulfuric acid and hydrogen peroxide, sodium persulfate, ammonium persulfate, etc. to form a conductor circuit 11 from the electroless plating layer 7 and electroplating copper layer 9 and having a thickness of about 15 μm and L/S ratio of 25/25 μm. At this time, the viahole 10 had a depression of about 5 μm in depth found on the surface hereof.

(9) As at the step (2) for the example 1, a rough surface layer 3 was formed on the substrate. Further, the steps (3) to (8) for the example 1 were repeated to produce a multilayer printed wiring board (as in FIG. 2(*c*)).

Owing to the depression formed on the central surface portion of the viahole, the thin conductor layer was not separable so that a fine circuit pattern of L/S=25/25 μm could be positively formed.

Example 5

A multilayer printed wiring board was produced by repeating the steps (1) to (3) for the example 3, and further processing the substrate as follows:

(4) The B-stage sheet was attached on the substrate at the step (2) for the example 4, and pressed under a pressure of 80 kg/cm$^2$ at 175° C. to form an interlaminar insulative resin layer. Further, the layer was exposed to an ultraviolet laser of 220 nm in wavelength to form holes for viaholes of 60 μm in diameter. Thereafter, the steps (4) to (9) for the example 4 was repeated to produce the multilayer printed wiring board.

Comparative Example 3

A multilayer printed wiring board was produced similarly to the embodiment 1 as disclosed in the Japanese unexamined patent publication No. Hei 2-188992. As a result, the holes in the interlaminar insulative resin layer were found filled with the plating layer. For a circuit pattern of L/S=25/25 µm, however, the plating resist was etched but too much, resulting in breakage of the circuit pattern.

Comparative Example 4

According to the Japanese unexamined patent publication No. Hei 9-312472, a multilayer printed wiring board was produced. More particularly, the steps (1) to (5) for the embodiment 5 were repeated and then the substrate was dipped in an electroless plating solution prepared from an aqueous solution composed of 0.05 mol/l of copper sulfide, 0.30 mol/l of formalin, 0.35 mol/l of sodium hydroxide, and 0.35 mol/l of ethylenediaminetetraacetic acid (EDTA) to form a plating layer of 40 µm in thickness.

A dry film was attached to the substrate, exposed and developed to form an etching resist of L/S=25/25 µm on the substrate. For etching, the substrate was dipped in a mixed solution of sulfuric acid and hydrogen peroxide. However, the conductor circuitry layer was undercut and separated.

As having been described in the above, the second embodiment of the present invention provides a multilayer printed wiring board having a filled viahole structure which can surely prevent the wiring board from line-breakage and implement an ultrafine circuit pattern of L/S=25/25 µm.

Example 6

A multilayer printed wiring board was produced by repeating the steps (1) to (5) for the example 1, and further processing the substrate as follows:

(6) A plating resist layer 8 of 15 µm in thickness and L/S=25/25 µm was formed on the electroless plating layer 7 in the conventional manner (see FIG. 2(a)).

(7) Next, a portion on which the plating resist layer 8 was not formed was electroplated under the following conditions to form an electroplating layer 15 µm in thickness on the portion. The layer 9 provided a conductor layer on which a conductor circuit was to be formed, and the electroplating layer 9 was filled in the hole to form a viahole 10 (as in FIG. 2(b)).

Aqueous Electroplating Solution:

| | |
|---|---|
| $CuSO_4 \cdot 5H_2O$ | 60 g/l |
| Leveling agent (HL by ATOTTECH) | 40 ml/l |
| Sulfuric acid | 190 g/l |
| Brightening agent (UV by ATOTTECH) | 0.5 ml/l |
| Chlorine ion | 40 ppm |

Electroplating Conditions:

| | |
|---|---|
| Bubbling | 3.0 liters/min |
| Current density | 0.5 A/dm$^2$ |
| Set current value | 0.18 A |
| Plating length of time | 100 min |

(8) The plating resist layer 8 was separated and removed, and then the electroless plating layer 7 under the plating resist layer 8 was dissolved for removal in an etching solution composed of a mixture of sulfuric acid and hydrogen peroxide, sodium persulfate, ammonium persulfate, etc. to form a conductor circuit 11 made of the electroless plating layer 7 and electroplating copper layer 9 and having a thickness of about 15 µm and L/S ratio of 25/25 µm. At this time, the viahole 10 had a flat surface.

(9) As at the step (2) for the example 1, a rough surface layer 3 was formed on the substrate. Further, the steps (3) to (8) for the example 1 were repeated to produce a multilayer printed wiring board (as in FIG. 2(c)).

Owing to the depression formed on the central surface portion of the viahole, the thin conductor layer was not separable so that a fine circuit pattern of L/S=25/25 µm could be formed.

Example 7

A multilayer printed wiring board was produced by repeating the steps (1) to (3) for the example 2, and further processing the substrate as follows:

(4) The B-stage sheet was attached on the substrate at the step (2) for the example 6, and pressed under a pressure of 80 kg/cm$^2$ at 175° C. to form an interlaminar insulative resin layer. Further, the layer was exposed to an ultraviolet laser of 220 nm in wavelength to form holes for viaholes of 60 µm in diameter. Thereafter, the steps (4) to (9) for the example 6 was repeated to produce the multilayer printed wiring board.

Comparative Example 5

A multilayer printed wiring board was produced similarly to the embodiment as disclosed in the Japanese unexamined patent publication No. hei 2-188992. In this case, the holes for viaholes were filled only with the electroless plating layer to form the viaholes.

Comparative Example 6

A multilayer printed wiring board was produced by repeating the steps (1) to (3) for the example 6 and further processing the substrate as follows. The substrate was dipped in an electroless plating solution prepared from an aqueous solution composed of 0.05 mol/l of copper sulfide, 0.30 mol/l of formalin, 0.35 mol/l of sodium hydroxide, and 0.35 mol/l of ethylenediaminetetraacetic acid (EDTA) to form a plating layer of 1 µm in thickness.

Further the steps (6) to (9) for the example 6 were repeated to produce the multilayer printed wiring board.

Note that this multilayer printed wiring board had no roughed surface on the viahole.

For checking a separation and crack at the viahole, the examples 6 and 7 and comparative examples 5 and 6 were heated at 128° C. for 48 hours, and then heated and cooled alternately 1,000 times at a temperature ranging from −55° C. to 125° C. The test results are shown in Table 2.

TABLE 2

| | Separation of viahole | Cracking in viahole |
|---|---|---|
| Example 6 | No | No |
| Example 7 | No | No |
| Comparative example 5 | No | Yes |
| Comparative example 6 | Yes | No |

As seen from Table 2, the comparative example 5 showed a cracking in the viahole portion, and the comparative example 6 showed a separation of the viahole portion. However, the examples 6 and 7 showed neither separation nor cracking at the viahole portion.

As having been described in the foregoing, the third embodiment of the present invention provides a multilayer printed wiring board having a filled viahole structure in which the viahole is not easily separable and no crack takes place under a thermal shock or due to heat cycle.

Example 8

A multilayer printed wiring board was produced of which the interlaminar insulative resin layer was made of a composite of fluororesin and heat-resistant thermoplastic resin, through a process including the following steps:

(1) An interlaminar insulative resin liquid was prepared by thermally fusing and mixing eight parts by weight of polyether sulfone (PES) and 92 parts by weight of fluororesin (Teflon by Du Pont) at 350° C.

(2) A substrate 1 made of bismaleimide triazine (BT) and having a conductor circuitry layer 2 formed on either surface thereof (as in FIG. 3(a)) was dipped in an electroless plating solution composed of 8 g/l of copper sulfide, 0.6 g/l of nickel sulfide, 15 g/l of citric acid, 29 g/l of sodium hypophosphite, 31 g/l of boric acid and 0.1 g/l of surfactant and having a pH of 9 to precipitate a roughened surface layer 3 of copper, nickel and phosphorus to a thickness of 3 μm on the surface of the conductor circuitry layer 2. Then, the substrate 1 was washed in water. It was dipped in an electroless tin-substitution plating bath composed of 0.1 mol/l of tin boron-fluoride and 1.0 mol/l of thiocarbamide at 50° C. for 1 hour to precipitate a tin layer of 0.3 μm on the surface of the roughened surface layer 3 (as in FIG. 1(b); the tin layer is not illustrated).

(3) The interlaminar insulative resin liquid prepared at the above step (1) was applied to the substrate 1 processed at the step (2) (as in FIG. 3(c), and cooled to form an interlaminar insulative resin layer 4 of 20 μm in thickness. An ultraviolet laser of 220 nm in wavelength was irradiated to the interlaminar insulative resin layer 4 to form holes 5 of 60 μm in diameter for viaholes (as in FIG. 3(d)).

(4) Using Pd as target, sputtering was made at 200 W for 1 min to implant Pd nucleus into the interlaminar insulative resin layer 4.

(5) The substrate 1 processed at the step (4) was dipped in the electroless plating solution to form an electroless plating copper layer 7 to a thickness of 0.6 μm over the surface of the interlaminar insulative resin layer 4 including the holes (as in FIG. 3(e)).

(6) A plating resist layer 8 was formed on the electroless plating copper layer 7 in the conventional manner (see. FIG. 4(a)).

(7) Next, a portion on which the plating resist layer 8 was not formed was electroplated under the following conditions to form an electroplating layer of 15 μm in thickness on the portion. The layer 9 provided a conductor layer on which a conductor circuit was to be formed, and the electroplating layer 9 was filled in the hole to form a viahole 10 (as in FIG. 4(b)).

Aqueous Electroplating Solution:

| | |
|---|---|
| CuSO$_4$•5H$_2$O | 60 g/l |
| Leveling agent (HL by ATOTTECH) | 40 ml/l |
| Sulfuric acid | 190 g/l |
| Brightening agent (UV by ATOTTECH) | 0.5 ml/l |
| Chlorine ion | 40 ppm |

Electroplating Conditions:

| | |
|---|---|
| Bubbling | 3.0 liters/min |
| Current density | 0.5 A/dm$^2$ |
| Set current value | 0.18 A |
| Plating length of time | 130 min |

(8) The plating resist layer 8 was separated and removed, and then the electroless plating copper layer 7 under the plating resist layer 8 was dissolved for removal in an etching solution composed of a mixture of sulfuric acid and hydrogen peroxide, sodium persulfate, ammonium persulfate, etc. to form a conductor circuit 11 from the electroless plating copper layer 7 and electroplating copper layer 9 and having a thickness of about 15 μm.

At this time, the viahole 10 had a flat surface, and the conductor circuitry layer surface was at a same level as the viahole surface.

(9) As at the step (2), a rough surface layer 3 was formed on the substrate. Further, the steps (3) to (8) were repeated to produce the multilayer printed wiring board (as in FIG. 4(c)).

Example 9

A multilayer printed wiring board was produced of which the interlaminar insulative resin layer was made of a composite of fluororesin and thermosetting resin, by repeating the above steps (1) to (3) for the example 3 and further processing the substrate as follows:

(4) The B-stage sheet was attached on the substrate at the step (2) for the example 8, and pressed under a pressure of 80 kg/cm$^2$ at 175° C. to form an interlaminar insulative resin layer. Further, the layer was exposed to an ultraviolet laser of 220 nm in wavelength to form holes for viaholes of 60 μm in diameter. Thereafter, the steps (4) to (9) for the example 8 was repeated to produce the multilayer printed wiring board.

Example 10

A multilayer printed wiring board of which the interlaminar insulative resin layer was made of a composite of thermosetting and thermoplastic resins was produced by repeating the steps (1) to (6) for the example 1 and further processing the substrate as follows:

(7) A portion on which the plating resist layer was not formed was electroplated under the same conditions as at the step (7) for the example 8 to form an electroplating layer 15 μm in thickness on the portion. The layer 9 provided a conductor layer on which a conductor circuit was to be formed, and the electroplating layer 9 was filled in the hole to form a viahole 10.

(8) The plating resist layer 8 was separated and removed, and then the electroless plating layer 7 under the plating resist layer 8 was dissolved for removal in an etching solution composed of a mixture of sulfuric acid and hydrogen peroxide, sodium persulfate, ammonium persulfate, etc. to form a conductor circuit 11 having a thickness of about 15 μm and consisting of the electroless plating layer 7 and electroplating copper layer 9.

At this time, the viahole 10 had a flat surface, and the conductor surface was at a same level as the viahole surface.

(9) As at the step (2), a rough surface layer was formed on the substrate. Further, the steps (3) to (8) were repeated to produce the multilayer printed wiring board.

Comparative Example 7

A multilayer printed wiring board was produced of which the interlaminar insulative resin layer was made only of a thermosetting resin, as follows:

(1) Compositions prepared through the following steps ① to ③ were mixed together and agitated to prepare an electroless plating adhesive.

① Thirty-five parts by weight (80% in solid content) of a 25% acrylated product of cresol novolac type epoxy resin (2500 in molecular weight, by Nippon Kayaku Co., Ltd.), 4 parts by weight of photosensitive monomer (ARONIX M315 by To a Gosei Co., Ltd.), 0.5 part by weight of antifoaming agent (S-65 by SANNOPCO) and 3.6 parts by weight of NMP, were mixed by agitation.

② Twenty parts by weight of NMP were added to 7.245 parts by weight of epoxy resin particles (POLYMER-POLE by Sanyo Kasei Co., Ltd.) of 0.5 μm in mean particle size. They were mixed together by agitation.

③ Two parts by weight of imidazole curing agent (2E4MZ-CN by Shikoku Kasei Co., Ltd.), 2 parts by weight of initiator (IRGACURE I-907 by Ciba Geigy), 0.2 part by weight of photosensitizer (DETX-S by Nippon Kayaku Co., Ltd.) and 1.5 parts by weight of NMP were mixed together by agitation.

Thereafter, steps (2) to (9) for the example 10 were repeated to provide the multilayer printed wiring board.

Comparative Example 8

A multilayer printed wiring board was produced in the same manner as for the example 8 except that no leveling agent and brightening agent were added to the electroplating solution. As a result, a plating layer could not sufficiently be filled in the holes for the viaholes.

For evaluation of the examples 8 to 10 and comparative examples 7 and 8, they were subjected to a heat cycle test in which they were heated and cooled alternately 500 times at a temperature ranging from −55° C. to 125° C., and then to another heat cycle in which they were heated and cooled alternately 1,000 times at the temperature range of −55° C. to 125° C. A light-optic microscope was used to check for any crack having started at the viahole, separation or crack of the plating layer forming the viahole. The test results are shown in Table 3.

TABLE 3

|  | Crack starting at viahole | | Separation or crack of plating layer | |
| --- | --- | --- | --- | --- |
|  | 500 heat cycles | 1000 heat cycles | 500 heat cycles | 1000 heat cycles |
| Example 8 | No | No | No | No |
| Example 9 | No | No | No | No |
| Example 10 | No | Yes | No | No |
| Comparative example 7 | Yes | Yes | No | No |
| Comparative example 8 | No | No | Yes | Yes |

As seen from Table 3, the example 8 is highly resistant against violent temperature variation since its interlaminar insulative resin layer incorporates a fluororesin and thermoplastic resin.

As having been described in the foregoing, the fourth embodiment of the present invention provides a multilayer printed wiring board having a filled viahole structure permitting to positively prevent line breakage in the wiring board and improved in resistance against violent temperature variation.

Example 11

A multilayer printed wiring board was produced by repeating the steps (1) to (9) for the example 1, and further processing the substrate as follows:

(10) As at the step (2) for the example 1, a roughened surface layer 3 was provided by electroless copper-nickel-phosphorus plating.

On the other hand, a solder resist composition was prepared by mixing 46.67 pads by weight of a photosensitive oligomer (4000 in molecular weight) produced by acrylating 50% of epoxy group of a 60% by weight of cresol novolac type epoxy resin (by Nippon Kayaku Co., Ltd.) solved in DMDG (diethyleneglycoldimethylether), 6.666 parts by weight of a 80% by weight of bisphenol A type epoxy resin (EPICOAT 1001 by YUKA SHELL) solved in MEK (methylethylketone), 6.666 parts by weight of an epoxy resin of the same bisphenol A type (EPICOAT E-1001-B80 by YUKA SHELL), 1.6 parts by weight of imidazole (2E4MZ-CN by Shikoku Kasei Co., Ltd.), 1.5 parts by weight of a polyvalent acryl monomer being a photosensitive monomer (R604 by Nippon Kayaku Co., Ltd.), 3.0 parts by weight of a same polyfunctional acryl monomer (DPE6A by KYOEISHA KAGAKU Co., Ltd.) and 0.36 part by weight of leveling agent made from an acrylic ester polymer (POLYFLOW No. 75 by KYOEISHA KAGAKU). Further, 2.0 parts by weight of an initiator (IRGACURE 1-907 by Ciba Geigy) and 0.2 part by weight of photosensitizer (DETX-S (by Nippon Kayaku Co., Ltd.) were added to the above mixture. Furthermore, 0.6 part by weight of DMDG was added to the mixture to adjust the viscosity to 1.4±0.3 Pa·s at 25° C.

The viscosity of the solder resist composition was measured using a B-type viscometer (DVL-B by Tokyo Keiki). For 60 rpm, No. 4 rotor was used with the viscometer. For 6 rpm, No. 3 rotor was used.

(11) The substrate prepared at the step (10) was applied on either side thereof with the solder resist composition to a thickness of 20 μm. The substrate was dried at 70° C. for 20 min, and then at 70° C. for 30 min. Then, a photomasking film of 5 mm in thickness having a circular pattern (mask pattern) depicted thereon was mounted on the substrate, and the substrate was exposed to an ultraviolet radiation of 1000 mJ/cm² in wavelength and developed in DMDG.

Further, the substrate was heated at 80° C. for 1 hour, at 100° C. for 1 hour, at 120° C. for 1 hour and then at 150° C. for 3 hours to form a solder resist layer 120 (of 20 μm in thickness) open at the solder pad portion thereof (opening diameter of 200 μm) (as in FIG. 5(a)).

(12) Next, the substrate having the solder resist layer 120 formed thereon was dipped for 20 min in an aqueous electroless plating solution composed of 30 g/l of nickel chloride, 10 g/l of sodium hypophosphite and 10 g/l of sodium citrate and having a pH of 5, to form a nickel plating layer 140 of 5 μm in thickness on the hole inner wall. Further, the substrate was dipped in an aqueous electroless plating solution composed of 2 g/l of gold potassium cyanide, 75 g/l of ammonium chloride, 50 g/l of sodium citrate and 10 g/l of sodium hypophosphite at 93° C. for 23 sec to precipitate a gold plating layer 150 to a thickness of 0.03 μm on the nickel plating layer 140.

(13) A printing mask was placed on the hole in the solder resist layer 120, a solder paste was printed and reflowed at 200° C. to form a solder bump (solder) 160. Thus a printed wiring board having the solder bump was produced (as in FIG. 5(*b*)).

In the conventional printed wiring board, since the viahole is not filled, a large amount of solder paste has to be used or the printing mask hole has to be large to form a solder bump as high as the solder bump of a flat solder pad. In the multilayer printed wiring board according to the present invention, however, since the viahole is filled, the solder paste can be applied uniformly and the hole in the printing mask may be uniform in size.

As having been described in the foregoing, the present invention provides a multilayer printed wiring board best suitable for forming a fine circuit pattern thereon, providing an excellent adhesion between the conductor circuit and interlaminar insulative resin layer and an outstanding resistance against cracking due to heat cycle.

Therefore, the multilayer printed wiring board according to the present invention has an excellent applicability in many fields of art requiring a high performance and high packaging density of electronic parts.

What is claimed is:

1. A printed wiring board, comprising:
   a plurality of first conductive circuits forming a first conductor circuit layer;
   an interlaminar insulative layer formed over the first conductor circuit layer and having a via-hole opening formed through the interlaminar insulative layer, the via-hole opening extending to one of the first conductive circuits;
   a via conductor structure formed in the via-hole opening of the interlaminar insulative layer and comprising a metal plating such that the metal plating is filling and closing the via-hole opening formed in the interlaminar insulative layer; and
   a plurality of second conductive circuits formed over the interlaminar insulative layer and forming a second conductor circuit layer comprising the metal plating filling the via-hole opening,
   wherein the plurality of second conductive circuits of the second conductor circuit layer includes a portion of the via conductor structure such that the portion comprising the metal plating filling the via-hole opening is extending out of the via-hole opening over the interlaminar insulative layer and has a substantially flat surface, the interlaminar insulative layer and the via-hole opening satisfy D1/T1 in a range of from 1 to 4, where D1 represents a diameter of the via-hole opening, and T1 represents a thickness of the interlaminar insulative layer, the via conductor structure comprises an electroless plating layer and the metal plating comprising an electrolytic plating, the electroless plating layer is formed on an inner wall of the via-hole opening in the interlaminar insulative layer and forms an inner space defined by the electroless plating layer inside the via-hole opening, the electrolytic plating is filling UP the inner space defined by the electroless plating layer, the portion of the metal plating of the via conductor structure extending out of the via-hole opening comprises the electroless plating layer having a thickness in a range of 0.1 to 5 μm and the electrolytic plating having a thickness in a range of 5 to 30 μm.

2. The printed wiring board according to claim 1, further comprising:
   a second interlaminar insulative layer formed over the plurality of second conductive circuits and the interlaminar insulative layer and having a via-hole opening extending to the portion of the metal plating of the via conductor structure; and
   a second via conductor structure formed in the via-hole opening of the second interlaminar insulative layer such that the second via conductor structure is positioned directly above the via conductor structure.

3. The printed wiring board according to claim 2, wherein the second interlaminar insulative layer and the second via-hole opening satisfy D2/T2 in a range of from 1 to 4, where D2 represents a diameter of the second via-hole opening, and T2 represents a thickness of the second interlaminar insulative layer.

4. The printed wiring board according to claim 2, wherein the second via conductor structure has a portion extending out of the via-hole opening formed in the second interlaminar insulative layer, and the portion of the second via conductor has a substantially flat surface.

5. The printed wiring board according to claim 2, wherein the second via conductor structure comprises a metal plating such that the metal plating of the second via conductor is filling and closing the via-hole opening formed in the second interlaminar insulative layer, and the metal plating of the second via conductor structure has a portion extending out of the via-hole opening of the second interlaminar insulative layer and having a substantially flat surface.

6. The printed wiring board as set forth in claim 2, wherein the second via conductor structure comprises an electroless plating layer and an electrolytic plating, the electroless plating layer is formed on an inner wall of the via-hole opening in the second interlaminar insulative layer and forms an inner space defined by the electroless plating layer inside the via-hole opening, and the electrolytic plating is filling up the inner space defined by the electroless plating layer in the second via conductor structure.

7. The printed wiring board as set forth in claim 6, wherein the plurality of second conductive circuits in the second conductor circuit layer includes at least one conductor circuit connected to the via conductor structure.

8. The printed wiring board as set forth in claim 6, wherein the second interlaminar insulative layer and the via-hole opening satisfy D2/T2 of from 1 to 4, where D2 represents a diameter of the via-hole opening in the second interlaminar insulative layer, and T2 represents a thickness of the second interlaminar insulative layer.

9. The printed wiring board as set forth in claim 8, wherein the electroless plating layer has a thickness which is 0.1—5 μm inside the via-hole opening of the second interlaminar insulative layer.

10. The printed wiring board as set forth in claim 6, further comprising:
    a solder resist layer formed over the second conductor circuit layer and the second interlaminar insulative layer.

11. The printed wiring board as set forth in claim 2, wherein the second via conductor structure comprises an electroless plating layer formed on an inner wall of the via-hole opening in the second interlaminar insulative layer and forming an inner space defined by the electroless plating layer inside the via-hole opening in the second interlaminar insulative layer.

12. The printed wiring board as set forth in claim 1, further comprising:
    a second interlaminar insulative layer formed over the plurality of second conductive circuits and the interlaminar insulative layer, wherein the substantially flat surface of the via conductor structure and a surface of the second conductor circuit layer are roughened.

13. The printed wiring board as set forth in claim 1, wherein the plurality of second conductive circuits in the second conductor circuit layer includes at least one conductor circuit connected to the via conductor structure.

14. The printed wiring board as set in claim 1, further comprising a second interlaminar insulative layer formed over the plurality of second conductive circuits and the interlaminar insulative layer, wherein the second interlaminar insulative layer has a hole formed such that a ratio of a diameter of the hole and a thickness of the second interlaminar insulative layer is within a range of 1 to 4.

15. The printed wiring board as set forth in claim 1, further comprising a second interlaminar insulative layer formed over the plurality of second conductive circuits and the interlaminar insulative layer.

16. The printed wiring board as set forth in claim 1, further comprising:
 a second interlaminar insulative layer formed over the plurality of second conductive circuits and the interlaminar insulative layer; and
 a second via conductor structure formed in the second interlaminar insulative layer and configured to electrically connect to one of the second conductive circuits in the second conductor circuit layer.

17. The printed wiring board as set forth in claim 16, wherein the second via conductor structure comprises an electroless plating layer and an electrolytic plating, the electroless plating layer is formed on an inner wall of the via-hole opening in the second interlaminar insulative layer and forms an inner space defined by the electroless plating layer inside the via-hole opening, and the electrolytic plating is filing up the inner space defined by the electroless plating layer in the second via conductor structure.

18. The printed wiring board as set forth in claim 1, further comprising:
 a second interlaminar insulative layer formed over the plurality of second conductive circuits and the interlaminar insulative layer; and
 a second via conductor structure formed in the second interlaminar insulative layer and configured to electrically connect a solder bump formed over the second interlaminar insulative layer and one of the second conductive circuits in the second conductor circuit layer.

19. The printed wiring board as set forth in claim 1, further comprising:
 a second interlaminar insulative layer formed over the plurality of second conductive circuits and the interlaminar insulative layer, wherein the substantially flat surface of the via conductor structure and a surface of the second conductor circuit layer are roughened.

20. The printed wiring board as set forth in claim 1, further comprising:
 a second interlaminar insulative layer formed over the plurality of second conductive circuits and the interlaminar insulative layer; and
 a solder resist layer formed over the second conductor circuit layer and the second interlaminar insulative layer.

\* \* \* \* \*